(12) United States Patent
Kowalski et al.

(10) Patent No.: US 12,085,624 B2
(45) Date of Patent: Sep. 10, 2024

(54) SYSTEMS, METHODS, AND DEVICES FOR FAILURE DETECTION OF ONE OR MORE ENERGY STORAGE DEVICES

(71) Applicant: Titan Advanced Energy Solutions, Inc., Salem, MA (US)

(72) Inventors: Jeffrey A. Kowalski, Somerville, MA (US); Steven A. Africk, Boston, MA (US); Jay F. Whitacre, Pittsburgh, PA (US); Thomas C. Ferree, Waltham, MA (US); Maura Appleberry, Louisville, KY (US); Shawn D. Murphy, Salem, MA (US); Sean O'Day, Boca Raton, FL (US)

(73) Assignee: Titan Advanced Energy Solutions, Inc., Salem, MA (US)

( * ) Notice: Subject to any disclaimer, the term of this patent is extended or adjusted under 35 U.S.C. 154(b) by 55 days.

(21) Appl. No.: 17/734,005

(22) Filed: Apr. 30, 2022

(65) Prior Publication Data

US 2022/0349948 A1  Nov. 3, 2022

Related U.S. Application Data

(60) Provisional application No. 63/210,413, filed on Jun. 14, 2021, provisional application No. 63/182,213, filed on Apr. 30, 2021.

(51) Int. Cl.
*G01R 31/396* (2019.01)
*G01R 31/36* (2020.01)
(Continued)

(52) U.S. Cl.
CPC ....... *G01R 31/396* (2019.01); *G01R 31/3646* (2019.01); *G01R 31/367* (2019.01); *G01R 31/382* (2019.01); *H02J 7/0031* (2013.01)

(58) Field of Classification Search
None
See application file for complete search history.

(56) References Cited

U.S. PATENT DOCUMENTS 10,014,561 B2  7/2018  Sood et al.
10,673,101 B2  6/2020  Sood et al.
(Continued)

OTHER PUBLICATIONS

International Search Report and Written Opinion, dated Oct. 26, 2022, for International Application No. PCT/US22/27159. (10 pages).
(Continued)

*Primary Examiner* — Roy Y Yi
(74) *Attorney, Agent, or Firm* — Rowan Tree Law Group, PLLC; Frederick F. Rosenberger

(57) ABSTRACT

An energy storage device management system can include a management portion for charging/discharging an energy storage device and an ultrasound interrogation portion for passing ultrasound energy through the energy storage device during charge/discharge cycles. A memory stores a stream of capture data instances derived from ultrasound energy exiting the energy storage device and baseline ultrasound data instances corresponding with the energy storage device during normal charging/discharging thereof. A processor can compare each capture data instance with the baseline ultrasound data and detect abnormal operating states of the energy storage device. A warning system can issue a notification when abnormal operating states are detected.

21 Claims, 11 Drawing Sheets

(51) Int. Cl.
*G01R 31/367* (2019.01)
*G01R 31/382* (2019.01)
*H02J 7/00* (2006.01)

(56) References Cited

U.S. PATENT DOCUMENTS

| | | | |
|---|---|---|---|
| 2013/0127624 A1 | 5/2013 | Sullivan et al. | |
| 2015/0002105 A1* | 1/2015 | Kelly | H02J 7/0048 |
| | | | 702/63 |
| 2016/0223498 A1* | 8/2016 | Steingart | G01N 29/46 |
| 2017/0067965 A9 | 3/2017 | Gach et al. | |
| 2018/0164383 A1* | 6/2018 | Hsieh | H01M 10/486 |
| 2019/0207274 A1 | 7/2019 | Ladpli et al. | |
| 2019/0319466 A1* | 10/2019 | Pk | H02J 7/007194 |
| 2020/0106137 A1 | 4/2020 | Murphy et al. | |
| 2020/0251788 A1 | 8/2020 | Sood et al. | |
| 2020/0379049 A1 | 12/2020 | Gray et al. | |
| 2021/0249702 A1 | 8/2021 | Murphy et al. | |
| 2022/0113284 A1 | 4/2022 | Sood et al. | |
| 2022/0397610 A1 | 12/2022 | Appleberry et al. | |

OTHER PUBLICATIONS

Belov et al., "Failure mechanism of Li-ion battery at overcharge conditions," *Journal of Solid State Electrochemistry*, 2008, 12: pp. 885-894. (10 pages).

Davies et al., "State of Charge and State of Health Estimation Using Electrochemical Acoustic Time of Flight Analysis," *Journal of the Electrochemical Society*, 2017, 164(12): pp. A2746-55. (10 pages).

Hsieh et al., "Electrochemical-Acoustic Time of Flight: In Operando Correlation of Physical Dynamics with Battery Charge and Health," *Energy & Environmental Science*, 2015, 8: pp. 1569-1577. (13 pages).

Wang et al., "Hazard Characterizations of Li-Ion Batteries: Thermal Runaway Evaluation by Calorimetry Methodology." in: ZHANG et al., *Rechargeable Batteries: Materials, Technologies and New Trends* (Switzerland, Springer International Publishing, 2015), pp. 434-445. (12 pages).

Yuan et al., "Overcharge failure investigation of lithium-ion batteries," *Electrochimica Acta*, 2015, 178: pp. 682-688. (7 pages).

* cited by examiner

FIG. 7    Test 1 CCRT

SYSTEMS, METHODS, AND DEVICES FOR FAILURE DETECTION OF ONE OR MORE ENERGY STORAGE DEVICES

CROSS-REFERENCE TO RELATED APPLICATIONS

The present application claims the benefit of U.S. Provisional Application No. 63/182,213, filed Apr. 30, 2021, entitled "Systems, Methods, and Devices for Battery Failure Detection," and U.S. Provisional Application No. 63/210,413, filed Jun. 14, 2021, entitled "Ultrasound-Battery Management Systems (U-BMS), and Energy Storage Systems Employing U-BMS," each of which is incorporated by reference herein in its entirety.

STATEMENT REGARDING FEDERALLY SPONSORED RESEARCH

This invention was made with government support under DE-SC0020735 awarded by the Department of Energy (DOE). The government has certain rights in the invention.

COPYRIGHT NOTICE

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document: "Copyright © 2021 2022 Titan Advanced Energy Solutions Inc.".

FIELD

The present disclosure relates generally to monitoring of one or more energy storage devices, such as one or more batteries, and more particularly, to detection of potential failure of the one or more energy storage devices before occurrence thereof, for example, via ultrasound interrogation.

BACKGROUND

Energy Storage Systems (ESSs, which may be comprised of one or more energy storage devices, such as a battery) can enable widespread integration with renewable energy sources (e.g., solar photovoltaic (PV), wind, tidal, etc.), and/or power generation systems to improve energy distribution and storage efficiency of isolated energy sources and storage facilities and the electric grid. ESSs can protect energy security, reduce carbon emissions, and introduce new revenue streams for a range of stakeholders. Yet only about 2.5% of total electricity production in the United States relies on grid energy storage. The principal barriers to widespread installation of ESSs are system cost and safety concerns. Electrochemical energy storage technologies (e.g., lithium-ion and other liquid electrolyte batteries) exhibit a high power or energy density, high charge and discharge efficiency, rapid energy delivery response time, and ease of portability, which may be especially desirable for certain applications. Indeed, rechargeable DC batteries have become the dominant choice for energy storage due to their decreasing costs, high cyclability, and technological maturity.

A major hindrance to widespread adoption of lithium-ion and other liquid electrolyte batteries for ESSs is the possibility of a battery/system failure, particularly a catastrophic failure in one or more batteries of the ESS (referred to as "thermal runaway") that can lead leading to fire or explosion. Thermal runaway events, and ensuing fires and explosions, have been a leading cause of catastrophic liquid electrolyte battery failure. Elevated ambient temperature (e.g., above 80° C.) can trigger additional internal heating of ESS batteries when an operating state of one or more batteries begins to deviate from normal battery operating state behavior. When a battery begins to deviate from normal operating state, a positive feedback cycle rapidly occurs that leads to an uncontrollable exothermic reaction. A primary trigger for this type of event is the generation of heat and/or gas within the battery cell. The heat of gas generation may be caused by a decomposition of the electrode materials and/or dissociation of the liquid electrolyte, which is a flammable carbonate. Thermal runaway can be caused by internal and external short-circuiting or by gas generation resulting from either over-charging, over-heating, or over-discharging. Once initiated, decomposition of the electrode materials and/or dissociation of the liquid electrolyte leads to electrolyte electrolysis, electrolyte degradation, and increased cell resistance, which in turn can cause cell over-heating during higher current use conditions.

Poor State-of-Health (SoH) energy storage devices (e.g., battery) have a lower charge capacity and therefore a lower discharge capability as compared with new devices. In the case of a single energy storage device, the SoH of the device may decrease as the number of charging and discharging cycles increases, until the device is no longer useful for its interned purpose. Moreover, if the device is always charged and discharged at the same constant current and/or constant voltage (e.g., as recommended for a device with an excellent SoH) over its full life cycle, the constant-current and constant-voltage charging/discharging potentially becomes over-charging and over-discharging toward the end of the device's life. As a result, the device can deviate from its normal operating state, potentially leading to the positive feedback cycle that results in thermal runaway. Such risks can increase when a plurality of energy storage devices, each of which have a different SoH, is collectively charged and discharged using the same charging and discharging parameters, e.g., constant current and voltage. In such cases, one or more of the plurality of energy storage devices can have a poor SoH and thus deviate from its normal operating state, thereby potentially leading to thermal runaway.

During failure associated with gas generation resulting from over-charging, over-heating, and/or over-discharging and subsequent electrolyte electrolysis and electrolyte degradation, lithium-ion batteries can move into a hazardous operating state as they evolve flammable gases within individual batteries or battery cells of an energy storage device or ESS. The gases present inside the energy storage device housing increase internal gas pressure and cause the energy storage device housing to swell. When a single battery within an ESS begins to fail, the electrical or thermal load on other batteries of the ESS increases, which can cause other cells to undergo failure as well. The sudden change in load and/or heat from a nearby fire or over-heated battery can lead to more batteries of the ESS experiencing thermal runaway.

Conventional methods to detect precursors to thermal runaway include detection of voltage changes, detection of a rapid temperature rise (e.g., ≥4° C. per second), or detection of gas escape. Such methods generally provide an advanced warning of rapid transition to a thermal runaway state on the order of 30 seconds to 5 minutes. However, a 30 second to 5-minute warning is impractical for taking corrective actions, e.g., warn nearby worker, to notify fire and safety groups, or to determine which energy storage device or devices are causing the advanced warning. Moreover, conventional advanced warning of rapid transition to a thermal runaway state usually occurs after the defective battery or energy storage device is permanently damaged.

In conventional systems, the main component of an ESS responsible for potentially minimizing risks associated with operating an ESS is the Battery Management System (BMS), which include a temperature monitoring module and a voltage- and current-monitoring module. The BMS can use the monitored information to estimate a SoC, a SoH, and/or battery resistance and may include a switching control module associated with each battery or energy storage device of the ESS. Unfortunately, as exhibited through numerous historical catastrophic events, conventional BMS modules are insufficient at reliably detecting impending ESS or individual energy storage device failure associated with evolved flammable gases, over-charging, over-discharging, electrolyte electrolysis, electrolyte degradation, and/or increased electrical resistance in individual cells or devices of ESSs.

Embodiments of the disclosed subject matter may address one or more of the above-noted problems and disadvantages, among other things.

SUMMARY

Embodiments of the disclosed subject matter system provide systems, devices, and methods for detecting precursors to thermal runaway of energy storage devices, for example, by monitoring a state (or respective states) of one or more energy storage devices using ultrasound interrogation. In some embodiments, in response to detecting one or more precursors to thermal runaway, an initial warning notification can be issued, for example, when an operating state of any one of the energy storage devices being monitored is determined to exhibit operating state characteristics that vary or differ from normal operating state characteristics. Alternatively or additionally, in some embodiments, in response to detecting one or more precursors to thermal runaway in any one of the energy storage devices being monitored, an E-Stop command can be issued, for example, to autonomously disconnect the energy storage device that exhibits the one or more precursors from all current sources.

In some embodiment, an ultrasound interrogation system can be operatively coupled to (e.g., electrically interfaced with) a battery management system (BMS) (e.g., of an energy storage system (ESS)). The ultrasound interrogation system can interrogate one or more energy storage devices using ultrasound, and the BMS can manage charging and/or discharging of the one or more energy storage device. In some embodiments, one or more memory devices can store baseline ultrasound data corresponding with normal operating state characteristics of one or more energy storage device types. In some embodiments, the normal operating state characteristics can include ultrasound interrogation signal data captured during a plurality of normal charging/discharging cycles of the one or more energy storage device types. Alternatively or additionally, in some embodiments, one or more data processing devices can be programmed to compare an ultrasound interrogation signal data stored in the one or more memory devices with ultrasound interrogation data derived from the one or more energy storage devices being monitored by the ultrasound interrogation system. In some embodiments, the stored ultrasound interrogation signal data can be captured during a plurality of normal charging/discharging cycles of the one or more energy storage device types.

Embodiments of the disclosed subject matter can have applications in various areas, such as, but not limited to, management of energy storage devices, energy storage device operating state monitoring, energy storage device safety and reliability evaluation, energy storage device State of Health (SoH) monitoring, energy stage device State of Charge (SoC) monitoring, and failure prediction and prevention. Alternatively or additionally, embodiments of the disclosed subject matter can be applied to a variety of systems and energy storage devices, such as, but not limited to, rechargeable DC batteries, Energy Storage Systems (ESSs), Battery Management Systems (BMSs), electronic devices that include energy storage devices and energy sources, and power generation systems associated with ESS.

Embodiments of the disclosed subject matter can identify potentially dangerous conditions or operating states of individual energy storage devices (e.g., lithium-ion batteries of an ESS or of a single energy storage device) and can provide an early warning when a device state is determined to deviate from a normal operating state thereof. In some embodiments, when one or more energy storage devices first begins to exhibit a potentially damaging operating state, an individual energy storage device or a plurality of energy storage devices can be autonomously or automatically disconnected from a current source (e.g., battery chargers), from power loads, and/or from other energy storage devices. In some embodiments, the disconnection can be early enough to prevent fire or explosion, to notify a human (e.g., user or operator), the BMS, or other system of the potential thermal runaway conditions in order to take corrective action, and/or to prevent permanent damage to the energy storage devices of the ESS.

In a representative embodiment, a method can comprise detecting ultrasound energy signal changes corresponding with an operating battery, and comparing the detected signal changes with battery signal changes observed during one or more battery failure modes. The method can further comprise terminating operating of the battery when the detected signal changes have characteristics of the battery signal changes observed during the one or more battery failure modes.

In another representative embodiment, a system can comprise one or more processors, and computer readable storage media. The computer readable storage media can store computer-readable instructions that, when executed by the one or more processors, cause the one or more processors to extract at least one feature of a detected ultrasound signal from a battery and generate one or more signals that indicate a battery fault in response to one or more of the extracted features satisfying one or more thresholds.

In another representative embodiment, a method can comprise detecting ultrasound transmitted through and/or reflected from an interior of a battery during charging or discharging thereof. The method can further comprise, based at least in part on the detected ultrasound satisfying one or more thresholds, providing an indication of battery fault.

In another representative embodiment, a system can comprise a battery management system, an ultrasound interrogation system, a data memory, and a data processor. The battery management system can be configured to manage charging and/or discharging of each of one or more energy storage devices. The ultrasound interrogation system can be operatively coupled to (e.g., electrically interfaced with) the battery management system and configured to pass ultrasound energy through the one or more energy storage devices during the charging and/or discharging thereof. The data memory can be configured to store (i) a capture data instance derived from ultrasound energy exiting the one or more energy storage devices and (ii) baseline ultrasound data corresponding with the one or more energy storage devices during the charging and/or discharging thereof. The data processor can be in communication with the data memory. The data processor can be configured to compare each capture data instance with the baseline ultrasound data and to detect, based at least in part on the comparison, an abnormal operating state of any one of the one or more energy storage devices during the charging and/or discharging thereof.

Any of the various innovations of this disclosure can be used in combination or separately. This summary is provided to introduce a selection of concepts in a simplified form that are further described below in the detailed description. This summary is not intended to identify key features or essential features of the claimed subject matter, nor is it intended to be used to limit the scope of the claimed subject matter. The foregoing and other objects, features, and advantages of the disclosed technology will become more apparent from the following detailed description, which proceeds with reference to the accompanying figures.

BRIEF DESCRIPTION OF THE DRAWINGS

Embodiments will hereinafter be described with reference to the accompanying drawings, which have not necessarily been drawn to scale. Where applicable, some elements may be simplified or otherwise not illustrated in order to assist in the illustration and description of underlying features. Throughout the figures, like reference numerals denote like elements.

DETAILED DESCRIPTION

General Considerations

Figure 1:
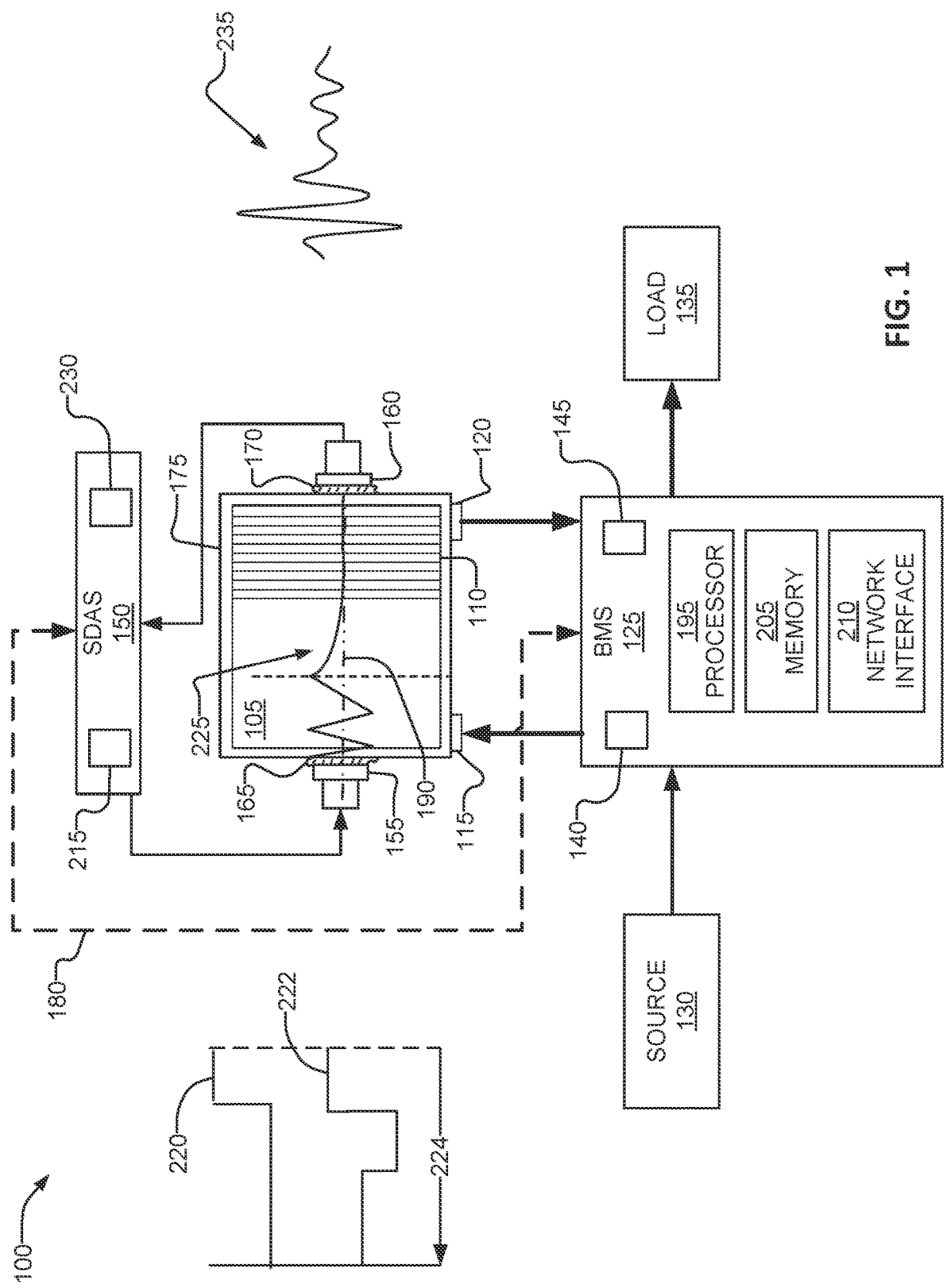
FIG. 1 is a simplified schematic diagram illustrating an exemplary ultrasound interrogation system, according to one or more embodiments of the disclosed subject matter. In the illustrated example, the ultrasound interrogation system (also referred to herein as ultrasound interrogation module) comprises an ultrasound emitter and an ultrasound receiver, each electrically interfaced with a signal drive and acquisition system. The signal drive and acquisition system can be configured to direct ultrasound energy into an energy storage device during charging and discharging and to receive ultrasound energy exiting from the energy storage device. The signal drive and acquisition system can also be configured to generate an electrical signal representative of the ultrasound energy exiting from the energy storage device.

For purposes of this description, certain aspects, advantages, and novel features of the embodiments of this disclosure are described herein. The disclosed methods and systems should not be construed as being limiting in any way. Instead, the present disclosure is directed toward all novel and nonobvious features and aspects of the various disclosed embodiments, alone and in various combinations and sub-combinations with one another. The methods and systems are not limited to any specific aspect or feature or combination thereof, nor do the disclosed embodiments require that any one or more specific advantages be present, or problems be solved. The technologies from any embodiment or example can be combined with the technologies described in any one or more of the other embodiments or examples. In view of the many possible embodiments to which the principles of the disclosed technology may be applied, it should be recognized that the illustrated embodiments are exemplary only and should not be taken as limiting the scope of the disclosed technology.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one skilled in the art.

The disclosure of numerical ranges should be understood as referring to each discrete point within the range, inclusive of endpoints, unless otherwise noted. Unless otherwise indicated, all numbers expressing quantities of components, molecular weights, percentages, temperatures, times, and so forth, as used in the specification or claims are to be understood as being modified by the term "about." Accordingly, unless otherwise implicitly or explicitly indicated, or unless the context is properly understood by a person skilled in the art to have a more definitive construction, the numerical parameters set forth are approximations that may depend on the desired properties sought and/or limits of detection under standard test conditions/methods, as known to those skilled in the art. When directly and explicitly distinguishing embodiments from discussed prior art, the embodiment numbers are not approximates unless the word "about" is recited. Whenever "substantially," "approximately," "about," or similar language is explicitly used in combination with a specific value, variations up to and including 10% of that value are intended, unless explicitly stated otherwise.

Directions and other relative references may be used to facilitate discussion of the drawings and principles herein, but are not intended to be limiting. For example, certain terms may be used such as "inner," "outer,", "upper," "lower," "top," "bottom," "interior," "exterior," "left," "right," "front," "back," "rear," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" part can become a "lower" part simply by turning the object over. Nevertheless, it is still the same part, and the object remains the same.

As used herein, "comprising" means "including," and the singular forms "a" or "an" or "the" include plural references unless the context clearly dictates otherwise. The term "or" refers to a single element of stated alternative elements or a combination of two or more elements unless the context clearly indicates otherwise.

Although there are alternatives for various components, parameters, operating conditions, etc. set forth herein, that does not mean that those alternatives are necessarily equivalent and/or perform equally well. Nor does it mean that the alternatives are listed in a preferred order, unless stated otherwise. Unless stated otherwise, any of the groups defined below can be substituted or unsubstituted.

Unless explained otherwise, all technical and scientific terms used herein have the same meaning as commonly understood to one skilled in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Features of the presently disclosed subject matter will be apparent from the following detailed description and the appended claims.

Overview of Terms

The following is provided to facilitate the description of various aspects of the disclosed subject matter and to guide those skilled in the art in the practice of the disclosed subject matter.

The abbreviations below are used throughout this description, unless specifically indicated otherwise:

| TERM | DEFINITION |
| --- | --- |
| ESS | Energy Storage System |
| BMS | Battery Management System |
| RMS | Root mean square |

The reference numbers below are used throughout this description and the accompanying drawings, unless specifically indicated otherwise:

| REF. NO. | DESCRIPTION | REF. NO. | DESCRIPTION |
| --- | --- | --- | --- |
| 100 | Ultrasound interrogation system | 105 | Energy storage device |
| 110 | Cell | 115 | Terminal |
| 120 | Terminal | 125 | BMS |
| 130 | Source | 135 | Load |
| 140 | Power Converter | 145 | Power Converter |
| 150 | Signal drive & acquisition system | 155 | Ultrasound emitter |
| 160 | Ultrasound receiver | 165 | Couplant |
| 170 | Couplant | 175 | Perimeter wall |
| 180 | Communication channel | 190 | Ultrasound energy axis |
| 195 | Processor | 205 | Memory |
| 210 | Network interface device | 215 | Signal generation portion |
| 220 | Electrical excitation signal | 222 | Electrical excitation signal |
| 224 | Total time duration | 225 | Ultrasound energy |
| 230 | Signal acquisition portion | 235 | Electrical response signal |
| 240 | Hilbert transform signal | 245 | Fourier transform signal |
| 250 | Voltage signal baseline | 255 | Temperature signal baseline |
| 260 | RMS signal baseline | 265 | Hilbert transform signal baseline |
| 270 | Fourier transform signal baseline | 275 | Voltage signal over-charging |
| 280 | Temperature signal over-charging | 285 | RMS signal over-charging |
| 290 | Hilbert transform signal over-charging | 295 | Fourier transform signal over-charging |
| 300 | Over-charge start time | 305 | Time of ultrasound warning notification |
| 310 | Time of E-stop command | 315 | Time of battery failure |
| 330 | Voltage signal over-charging | 335 | Temperature signal over-charging |
| 340 | RMS signal over-charging | 345 | Hilbert transform signal over-charging |
| 350 | Fourier transform signal over-charging | 355 | Voltage signal over-charging |
| 360 | Temperature signal over-charging | 365 | RMS signal over-charging |
| 370 | Hilbert transform signal over-charging | 375 | Fourier transform signal over-charging |
| 380 | Voltage signal over-charging | 385 | Temperature signal over-charging |
| 390 | RMS signal over-charging | 395 | Hilbert transform signal over-charging |
| 400 | Fourier transform signal over-charging | 405 | Support device |
| 410 | Support device | 415 | Backplate |
| 415A | Backplate | 420 | Spring |
| 425 | Temperature sensor | 430 | Actuator |
| 435 | Alarm system module | 440 | Data processor |
| 445 | Memory | 450 | Alarm indicator |
| 455 | Communication interface | 631 | Computing environment |
| 633 | Software | 635 | Central processing unit |

| REF. NO. | DESCRIPTION | REF. NO. | DESCRIPTION |
|---|---|---|---|
| 637 | Graphic or co-processing unit | 639 | Memory |
| 641 | Memory | 651 | Basic configuration |
| 661 | Storage | 681 | Input device(s) |
| 681 | Output device(s) | 691 | Communication connection(s) |

Introduction

Referring to FIG. 1, a non-limiting exemplary ultrasound interrogation system 100 is shown. The ultrasound interrogation system 100 can be coupled with or to an energy storage device 105. In one non-limiting example, the energy storage device can be a rechargeable lithium-ion battery or other liquid electrolyte battery system. The energy storage device 105 can include at least one cell 110. Each cell 110 can comprise an anode electrode ("anode"), a cathode electrode ("cathode"), and an electrically-insulating separator material layer ("separator") disposed between the anode and the cathode. Each of the anode and the cathode can be coupled to (e.g., electrically interfaced with) a respective one of a pair of battery terminals 115, 120. In some embodiments, the energy storage device 105 includes a plurality of the cells 110. For example, a plurality of battery cells 110 can be assembled inside a sealed housing or container formed by perimeter walls 175. The housing can be configured to receive the plurality of battery cells 110 therein. Although only a subset of battery cells 110 is shown on the right side of FIG. 1, in some embodiments, the entire housing can be filled with battery cells 110. Alternatively or additionally, in some embodiments, empty space in the housing can be filled with a liquid electrolyte and sealed, for example, such that each battery cell 110 is immersed in the liquid electrolyte.

In some embodiments, a battery management module or system (BMS) 125 can be provided as part of the ultrasound interrogation system 100 or as a separate component in operative communication with the ultrasound interrogation system 100. For example, the BMS can be operatively coupled to (e.g., electrically interfaced with) one or more energy sources 130 (e.g., a current or voltage source) and/or one or more energy loads 135 (e.g., a circuit or device that uses electrical energy stored by the energy storage device). In some embodiments, the BMS 125 can be operatively coupled to (e.g., electrically interfaced with) terminals 115, 120, which can extend through the perimeter walls 175 to each battery cell 110 (or be connected to an external surface contact portion by respective electrical connections or conduits). In some embodiments, the energy storage device 105, the external energy source 130, and/or the external energy load 135 may each comprise one or more rechargeable DC batteries electrically interconnected with the BMS 125. In some embodiments, the energy storage device 105 can be used to receive input power from the source 130, store the received input power, and/or output the stored power to the energy load 135.

For example, in the experimental results described hereinbelow, the external energy source 130 and an external energy load 135 were elements or terminals of a battery cycling module (a Neware BTS4000 series 8-channel 5V, 6 A cycler). The battery cycling module can be controlled to charge the energy storage device 105 at a constant current (CC) or at a constant voltage (CV) and/or to discharge the energy storage device 105 at a constant current (CC) or at a constant voltage (CV).

Returning to FIG. 1, in some embodiments, the external energy source 130 may comprise an electrical grid source interface, a renewable energy source interface, or any other energy storage or power generating system operable as an electrical energy or power source for charging the energy storage device 105 according to voltage and current charging requirements thereof. In some embodiments, the external energy load 135 may comprise an electronic device interface, e.g., with Electric Vehicle (EV) motor or other electric motor, with electronic computing, communication, or data storage systems, or with other electrical device loads that can receive electrical energy or power from the energy storage device 105 when output voltage and current ranges available from the energy storage device 105 are compatible with the loads 135 being powered.

In some embodiments, the BMS 125 may comprise one or more DC-to-DC one-way or bi-directional power converters 140, 145. The DC-to-DC power converters and the BMS 125 can be configured to modify a voltage of power received by the BMS 125, e.g., from the source 130 or from the energy storage device 105, for delivery to the load 135. In addition to or instead of altering voltage, the one or more one-way or bidirectional DC-to-DC power converters 140, 145 and the BMS 125 can be configured to modify or modulate a current of incoming power received from the source 130, or to modify or modulate a current of power being output from the energy storage device 105 to the load 135.

In some embodiments, a Signal Drive and Acquisition System (SDAS) 150 can be provided as part of the ultrasound interrogation system 100 or as a separate component in operative communication with the ultrasound interrogation system 100. For example, the SDAS 150 can be operatively coupled to (e.g., electrically interfaced with) an ultrasound emitter 155 and/or an ultrasound receiver 160. The ultrasound emitter 155 and/or the ultrasound receiver 160 can be held against a respective surface of the perimeter wall 175 by a respective biasing force (e.g., a biasing member, such as a spring 420 in FIGS. 11-12). The ultrasound emitter 155 and the ultrasound receiver 160 can be acoustically coupled to the perimeter wall by acoustic couplant 165 and acoustic couplant 170, respectively. For example, the acoustic couplants 165, 170 can each comprise a material layer selected to improve ultrasound energy transmission through the perimeter wall 175 into the energy storage device 105 by the ultrasound emitter 155 and to improve ultrasound energy transmission out of the energy storage device and through the perimeter wall 175 to the ultrasound receiver 160.

For example, in the experimental results described hereinbelow, the acoustic couplant comprised a thin layer (e.g., ~1.6 mm) of synthetic rubber (e.g., Viton® rubber). A first acoustic couplant was attached to a face of the ultrasound emitter and arranged between the emitter and the corresponding surface of the perimeter wall of the energy storage device. Similarly, a second acoustic couplant was attached to a face of the ultrasound receiver and arranged between the receiver and the corresponding surface of the perimeter wall of the energy storage device.

Returning to FIG. 1, in some embodiments, the ultrasound emitter 155 and the ultrasound receiver 160 can be held against opposite surfaces of the housing (e.g., perimeter walls 175 that are parallel and spaced from each other), and ultrasound energy can be directed into the energy storage device 105 by the ultrasound emitter 155 through a first surface of the perimeter wall. The ultrasound energy can be directed along an ultrasound energy axis 190 that is orthogonal (or at least substantially orthogonal) to opposite surfaces of each battery cell 110, such that the directed ultrasound energy passes through the anode, the separator, and the cathode of each battery cell 110 before exiting from the energy storage device 105 to the ultrasound receiver 160.

In some embodiments, a processor 195 (e.g., a digital data processor), a memory 205 (e.g., a digital data memory), and/or an interface device 210 (e.g., a digital network interface device) can be provided as part of the ultrasound interrogation system 100 or as one or more separate components in operative communication with the ultrasound interrogation system 100. In some embodiments, the processor 195, memory 205, and/or interface device 210 can be shared between the SDAS 150 and/or the BMS 125, for example, via communication channel 180. Additionally or alternatively, one or both of the SDAS 150 and the BMS 125 can include its own processor, memory, and/or interface device.

In some embodiments, the ultrasound interrogation system and BMS can be combined together, for example, to form an ultrasound-battery management system (U-BMS), such as described in underlying U.S. Provisional Application No. 63/210,413, incorporated herein by reference. For example, an Electrochemical Observation and Evaluation System (EchOes) can be configured to control and manage a plurality of ultrasonic transducers. For each battery module (e.g., one or more battery cells), at least one ultrasound transducer can be mechanically coupled with a surface thereof. Each ultrasound transducer can be operable to emit an ultrasound wave into a battery in response to an excitation signal received from the EchOes. Moreover, each ultrasound transducer can be operable to receive an ultrasound wave from the battery (e.g., reflected or transmitted) and to generate an electrical signal in response to the received ultrasound wave.

In some embodiments, the electrical signal can be transmitted to the EchOes for further processing and/or use. When a capture of ultrasound data is to be taken for all the batteries in an ESS, the U-BMS coordinator can send commands (e.g., electrical signals) to all connected EchOES devices to collect ultrasound data. In some embodiments, a coordinator module can pull voltage data and/or current data from the BMS for each battery. Once all data has been collected, the coordinator module of the U-BMS can send the data to a SoC/SoH modeling module. In some embodiments, the SoC/SoH modeling module can be located remote from the U-BMS (e.g., in the cloud). Alternatively or additionally, the SoC/SoH modeling module may be part of the BMS. The SoC/SoH modeling module can extract measurements, for example, for use in assessing precursors to thermal runaway. Alternatively or additionally, the coordinator module can assess system balance and can updates BMS balancing commands and capacity metrics for each battery of the ESS.

Returning to FIG. 1, in some embodiments, the SDAS 150 can include a signal generating portion 215 that is configured to generate an electrical excitation signal 220, 222 for delivery to the ultrasound emitter 155. In FIG. 1, two non-limiting exemplary electrical excitation signals 220 and 222 are shown, which correspond with two schematic voltage versus time signal representations. For example, a total time duration 224 of each exemplary electrical excitation signal 220, 222 can include a zero voltage portion and a constant peak voltage portion. In the illustrated example, a single voltage peak is shown for the electrical excitation signal 220, while two voltage peaks (e.g., a positive voltage peak and a negative voltage peak) are shown for the electrical excitation signal 222. In the example of electrical excitation signal 220, starting at the right side, the electrical excitation signal 220 initially has a constant positive voltage peak for a time duration, t1, and then a zero or baseline voltage for the remainder of the total time duration 224. In the example of electrical excitation signal 222, starting at the right side, the electrical excitation signal 222 initially has a positive voltage peak for a time duration t1, then a negative voltage peak for a second time duration, t2, and then a zero or baseline voltage for the remainder of the total time duration 224.

Either electrical excitation signals 220 or 222 can be used to excite the ultrasound emitter 155. Other excitation signal profiles and/or ultrasound waveforms are also possible according to one or more contemplated embodiments. In response to one of the electrical excitation signals (e.g., signal 220, 222, or other waveform), the ultrasound emitter 155 can emit ultrasonic energy into the energy storage device 105 directed along an ultrasound energy axis 190. In the illustrated example, the ultrasound energy axis is orthogonal to opposite main surfaces of the battery cells 110, such the ultrasound energy passes through each battery cell 110 before exiting from the energy storage device 105 to the ultrasound receiver 160.

In some embodiments, the ultrasound energy 225 can initially be diffracted as it passes through a Fraunhofer near-field zone and then passes to a Fraunhofer far-field zone. For example, the transition between the near-field zone and the far-field zone can be within the energy storage device 105 (e.g., inside the test battery). Characteristics of the ultrasound emitter 155 and the ultrasound energy emitted thereby can be selected to deliver the ultrasound energy 225 with an appropriate amplitude (e.g., in dB), for example, with an appropriate signal-to-noise (SNR) ratio, pulse duration (e.g., in ns), total pulse energy, pulse center frequency, and/or pulse bandwidth.

For example, in the experimental results described hereinbelow, the electrical excitation signal 222 was used, with a center frequency of a bipolar square wave pulse (positive first) of ~500 kHz and with an impulse voltage of ±90 V, and a total time duration of 20 ms. Further, the ultrasound energy axis was orthogonal to the battery thickness. The battery was an LG1P-531A lithium-ion battery having a thickness of ~1 cm, a length of ~8 cm, and a width of ~6 cm. Further, each ultrasound emitter and ultrasound receiver was a model CHG014 Microdot ultrasound transducer (available from NDT Systems, Huntington Beach, CA).

Returning to FIG. 1, in some embodiments, in response to receiving the ultrasound energy transmitted through the energy storage device 105, the ultrasound receiver 160 can generate an electrical response signal 235 based at least in part on and/or responsive to the ultrasound energy 225 received from inside the energy storage device 105. For example, the electrical response signal 235 can comprise a stream of instantaneous voltage versus time values. In some embodiments, the response signal 235 can be transmitted to the SDAS 150, for example, for processing and/or analysis. In some embodiments, the electrical response signal 235 can be an analog signal (e.g., a stream of voltage versus time values generated by the ultrasound receiver 160 in response to the received ultrasound energy 225), in which case the electrical response signal 235 can be converted to a digital representation of the stream by the ultrasound receiver 160 or by the SDAS 150. In some embodiments, the SDAS 150 can include a signal acquisition portion 230 configured to receive the electrical response signal 235 from the ultrasound receiver 160 (e.g., in either analog or digital format). Alternatively or additionally, the signal acquisition portion 230 can modify the electrical response signal 235 according to one or more ultrasound response signal evaluation schemas (e.g., operating on the processor 195 and/or a separate processor of the SDAS).

An exemplary electrical response signal 235 is shown in FIG. 1 to the right of the ultrasound receiver 160. In the illustrated example, reading from left to right, the electrical response signal 235 includes a main response portion (or peak amplitude) that corresponds with the ultrasound energy level when the ultrasound energy 225 first reaches the ultrasound receiver 160. The electrical response signal 235 may further include other response portions of less than the peak amplitude, for example, corresponding with scattered, reflected, or echoed ultrasound energy exiting from the energy storage device 150 at times following the main response portion.

In some embodiments, the SDAS 150 can be configured to fully receive the electrical response signal from the ultrasound receiver 160 up to a time limit or end time (e.g., ≤1 ms). In some embodiments, the time limit can be predetermined and/or set by a user or operator. Alternatively or additionally, in some embodiments, the time limit can be altered by the SDAS 150 according to settings selected by a user or operator and/or according to predetermined settings associated with the energy management schema operated by the SDAS 150. In some embodiments, the SDAS 150 can periodically and/or repeatedly apply the electrical excitation signals at consistent or varying intervals (e.g., ≤100 ms). In some embodiments, the time limit and/or the frequency of subsequent electronic excitations signals can be altered by the SDAS 150 according to settings selected by a user or operator and/or according to predetermined settings associated with the energy management schema operated by the SDAS 150. In some embodiments, such settings may be altered based on the thickness of the energy storage device, the relative positions of the ultrasound emitter and the ultrasound receiver (e.g. separation along the ultrasound axis 190), and/or time of flight (e.g., the time interval between sending the electrical excitation signal 222 and receiving by the signal acquisition portion 230 of the electrical response signal from the ultrasound receiver 160) samples for the energy storage device 105.

For example, in the experimental results described hereinbelow, the time limit was 70 µs, and the subsequent electrical excitation signals were transmitted by the signal generating portion every 20 ms.

Returning to FIG. 1, in some embodiments, upon receiving the electrical response signal 235 from the ultrasound receiver 160, the electrical response signal 235 can be modified by schema operating on the processor 195 (or a separate processor operated by the SDAS 150), for example, to form a capture data instance. The modifications of the electrical response signal 235 may include, but is not limited to, converting an analog signal to a digital signal representation, filtering the digital response signal of noise, filtering the digital response signal to reduce frequency content and/or to selectively filter spectral ranges of the frequency content from the digital response signal, filtering the digital response signal to remove outlier data points (e.g., peak or valley voltage values that are not statically significant), or any combination of the foregoing. Alternatively or additionally, the electrical response signal 235 may be amplified before and/or after converting the electrical response signal 235 to a digital response signal. Upon completion of modifications of the electrical response signal 235 by the SDAS schema, the modified digital electrical response signal can be stored as capture data in the memory 205, for example, associated with a time stamp and an identifier (e.g., a battery ID or the like) to uniquely identify the capture data.

In some embodiments, the SDAS 150 can be configured to send a series of ultrasound energy instances 225 through the energy storage device 105, and to then independently process the electrical response signal 235 associated with each of the ultrasound energy instances 225. For example, sixteen ultrasound energy instances 225 can be sent sequentially and independently processed by the SDAS 150. When the electrical response signals associated with all ultrasound energy instances 225 has been modified, the SDAS schema can calculate average, mean, and/or other voltage amplitude versus time data values for the multiple (e.g. sixteen) ultrasound energy instances 225. In some embodiments, the SDAS schema can combine the values into a single capture data instance. Once combined, the capture data comprising average, mean, or other voltage amplitude versus time data values can be stored as single capture data instance and associated with a time stamp and an identifier (e.g., a battery ID or the like) to uniquely identify the capture data instance.

Examples of Ultrasound Feature Extraction

The energy storage device used for the experimentation examples and battery characterization data was a lithium-ion battery (LGIP-531A, 950 mAh, 3.7V) manufactured by LG Corporation (Yeoudi-dong, South Korea). Such lithium-ion batteries are commonly used as a power source for cellphones or other portable electronic devices. Characterization methodologies can be performed on other energy storage devices and/or battery cells in a manner similar to that described hereinbelow for the LGIP-531A lithium-ion battery, and similar characterization data can be obtained. Accordingly, embodiments of the disclosed subject matter are not limited to the LGIP-531A lithium-ion battery in particular, nor lithium-ion batteries in general.

Baseline Data

Figure 2:
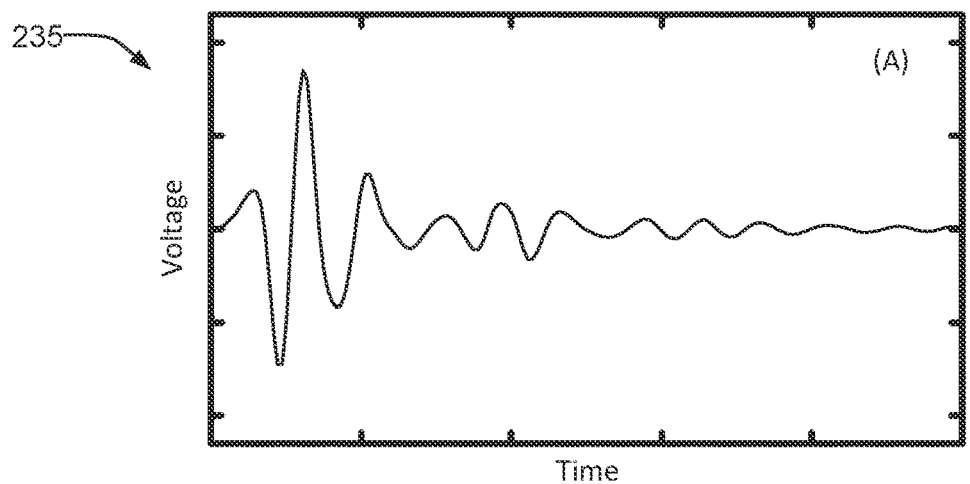
FIG. 2 depicts a graphical representation of an exemplary ultrasound signal feature extraction, according to one or more embodiments of the disclosed subject matter. In the illustrated example, the extraction comprises an electrical signal representative of the ultrasound energy exiting from the energy storage device.
Figure 3:
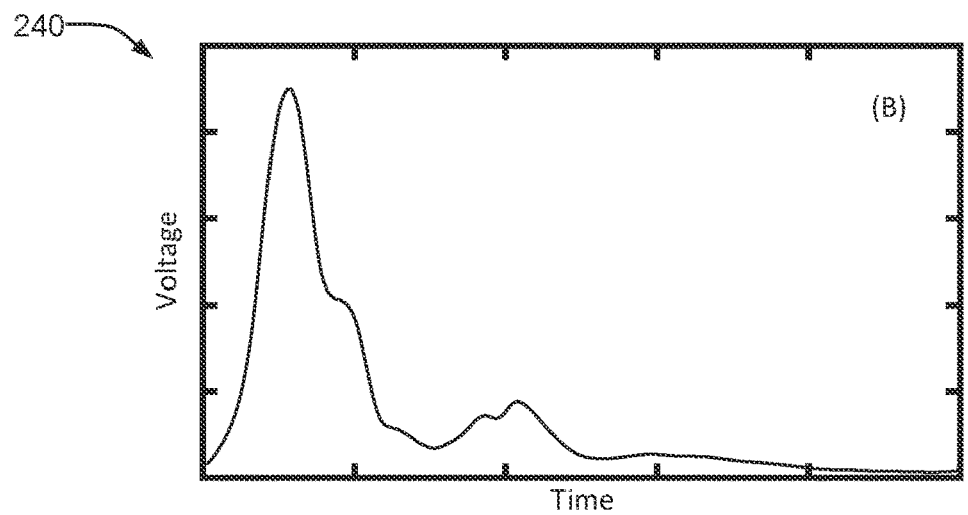
FIG. 3 depicts a graphical representation of another exemplary ultrasound signal feature extraction, according to one or more embodiments of the disclosed subject matter. In the illustrated example, the extraction comprises an electrical signal associated with a Hilbert transform of the electrical signal representative of the ultrasound energy exiting from the energy storage device.
Figure 4:
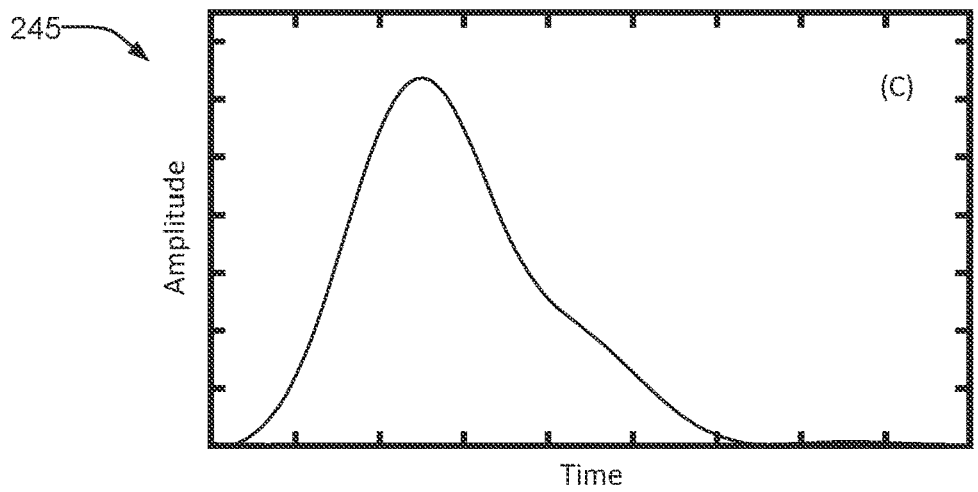
FIG. 4 depicts a graphical representation of another exemplary ultrasound signal feature extraction, according to one or more embodiments of the disclosed subject matter. In the illustrated example, the extraction comprises an electrical signal associated with a Fourier transform of the electrical signal representative of the ultrasound energy exiting from the energy storage device.

FIGS. 2-4 show graphical plots of ultrasound feature extraction generated by an ultrasound interrogation system in accordance with the configuration illustrated in FIG. 1. In particular, FIG. 2 depicts a voltage versus time plot of a non-limiting exemplary electrical response signal 235 (e.g., as described above). The time domain window is about 70 µs, and the electrical response signal 235 was repeated at 20 ms intervals in normal operation. FIG. 3 depicts a Hilbert transform signal 240 derived from a Hilbert transform of the electrical response signal 235. FIG. 4 depicts a Fourier transform signal 245 derived from a Fourier transform of the electrical response signal 235. In the illustrated examples, the electrical response signal 235 of FIG. 2 can be considered the capture data described above. In other words, the electrical response signal 235 of FIG. 2 is a digital signal that has been amplified, filtered, and otherwise modified by the schema operating on the SDAS 150. Each of the Hilbert transform signal 240 and the Fourier transform signal 245 corresponds with a transform of the electrical response signal 235 or capture data signal described above. The electrical response signal 235 comprises a stream of instantaneous voltage amplitude values at time (t) over a period of about 70 μs. The instantaneous voltage amplitude values at time (t) is stored in the memory 205.

Figure 5:
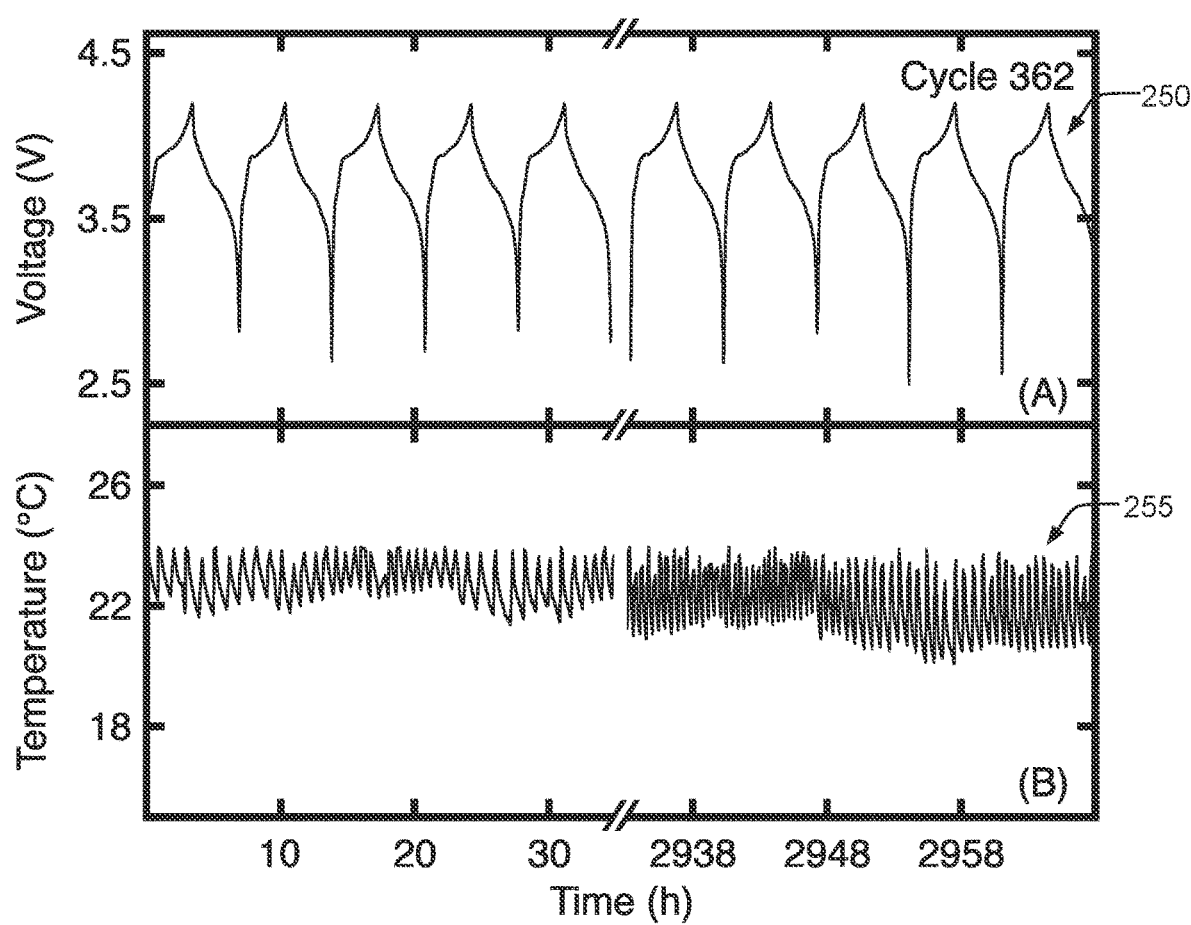
FIG. 5 depicts two graphical representations (A) and (B) of an exemplary electrical signal, according to one or more embodiments of the disclosed subject matter. In the illustrated example, electrical signal (A) is associated with baseline cycling data comprising an instantaneous voltage of the energy storage device over a plurality of charging and discharging cycles, and electrical signal (B) is associated with an instantaneous temperature of the energy storage device over the plurality of charging and discharging cycles.
Figure 6:
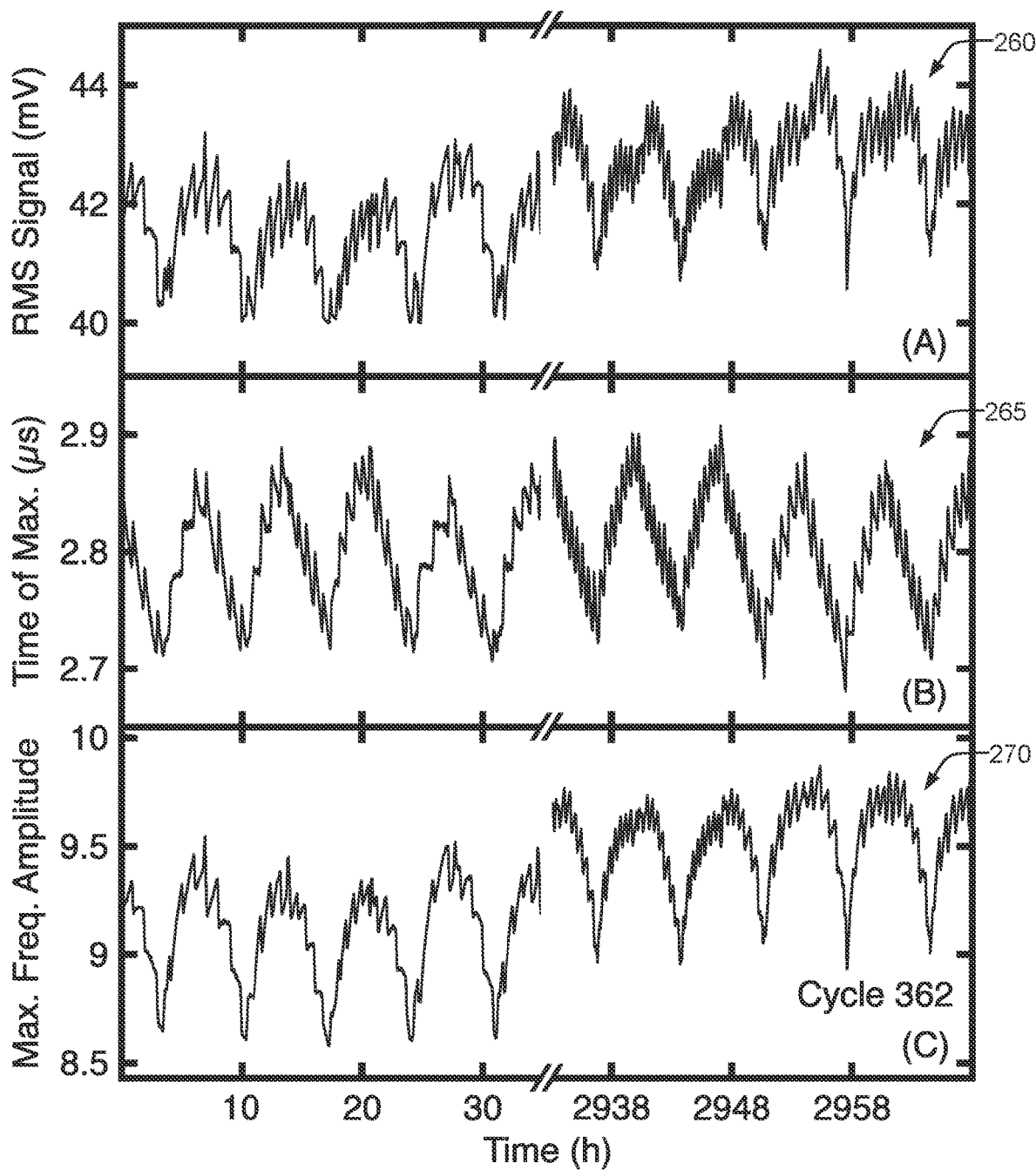
FIG. 6 depicts three graphical representations (A), (B), and (C) of an exemplary electrical signal, according to one or more embodiments of the disclosed subject matter. In the illustrated example, electrical signal (A) is associated with an ultrasound signal feature extraction example comprising a Root Mean Square of the electrical signal representative of the ultrasound energy exiting from the energy storage device, electrical signal (B) is associated with an ultrasound signal feature extraction example comprising a Hilbert transform of the electrical signal representative of the ultrasound energy exiting from the energy storage device, and electrical signal (C) is associated with an ultrasound signal feature extraction example comprising a Fourier transform of the electrical signal representative of the ultrasound energy exiting from the energy storage device.

FIGS. 5-6 show baseline test data for the LG1P-531A lithium-ion battery. The baseline test data is collected to characterize the energy storage device over many charging and discharging cycles. The charging and discharging cycles were controlled by a battery cycling device (Neware Model BTS4000 series 8-channel 5V, 6 A cycler), which was designed to characterize energy storage devices. The battery cycling device included a charging source and a discharging load mechanism. The discharging load mechanism was attached to terminals of the test device (e.g., terminals 115, 120), and the test device was automatically cycled by the battery cycling device between a fully charged state and a fully discharged state. The battery cycling device was configured to set charging and discharging voltage and current values, to measure instantaneous voltage and current amplitude during charging and discharging, to receive battery temperature measurement values from a temperature sensor associated with the test device, and to record the data in a memory. FIG. 5 shows the baseline data in plots (A) and (B) received from the battery cycling device. Alternatively or additionally, the battery cycling device may further determine and track instantaneous current amplitude, SoC, SoH, and/or resistance of the test device and record this additional data in a memory.

In some embodiments, the BMS can be configured to set charging and discharging voltage and current values, measure instantaneous voltage and current amplitude during charging and discharging, receive battery temperature measurement values from a temperature sensor associated with the test energy storage device, determine SoC and SoH of the test device, and/or record baseline data in a memory. Alternatively, in some embodiments, the BMS may lack the high precision charging and discharging modules provided by a battery cycling device, and thus the battery cycling device may be used in place of or in addition to monitoring/control by the BMS. In an exemplary operating mode, the instantaneous charging voltage and current of the battery cycling device can be set as follows: (i) charging settings 4.2V at 250 mA; (ii) discharging settings 2.5V at 250 mA.

In FIG. 5, the mean battery temperature in plot B is approximately 23° C., which is referred to hereinbelow as room temperature (RT). The left portions of plots (A) and (B) of FIG. 5 relate to the first 30 hours of battery cycling (e.g., about the first five full charging and discharging cycles). The right portions of plots (A) and (B) of FIG. 5 plots relate to the final 30 hours of battery cycling (e.g., full charging and discharging cycles), reflecting a total of 363 charging and discharging cycles. Together, plots (A) and (B) of FIG. 5 serve to characterize the state of the test device based on controlled battery voltage and temperature values measured over every charging and discharging cycle of the test battery during its useful life. Thus, the data of FIG. 5 provides a baseline data template that corresponds with a test battery operated under controlled parameters.

FIG. 6 shows baseline data for ultrasound extraction features of the capture data corresponding to the electrical response signal 235 recorded during the same controlled charging and discharging cycles described above and related to the baseline data shown in FIG. 5. The ultrasound extraction features are each derived from the electrical response signal 235 or from an ultrasound excitation feature (e.g., derived from an ultrasound extraction feature derived from the electrical response signal 235). As shown in plot (A) of FIG. 6, a modified ultrasound extraction feature signal 260 is derived from the electrical response signal 235 (or capture data), for example, by converting the voltage values of the electrical response signal 235 to Root Mean Square (RMS) voltage values 260. Each RMS voltage versus time instance (e.g., in mV) correlates with a corresponding voltage versus time (e.g., in V) of the electrical response signal 235. The RMS voltage values of the signal 260 can be used because the RMS voltage values also correlate with the amount of energy that can be added to the test energy storage device during charging. Thus, the RMS signal values 260 also include information corresponding with charging energy over the entire charging cycle. In practical embodiments, the electrical response signal 235 can be impacted by frequencies of the charging energy that can get through to the test energy storage device but that would not otherwise be accounted for when the voltage alone is considered. Thus, the RMS signal values 260 may provide more information than the voltage alone. For example, the electrical response signal 235 shown in FIG. 2 can be converted to an RMS signal 260 as shown in plot (a) of FIG. 6.

As shown in plot (B) of FIG. 6, a modified ultrasound extraction feature signal 265 is also derived from the electrical response signal 235 (or capture data). The modified ultrasound extraction feature signal 265 comprises a Hilbert transform of the electrical response signal 235 and then arranges the data plot to show a time (e.g., in μs) of the occurrence of a maximum voltage of the Hilbert transform. As shown in plot (c) of FIG. 6, a modified ultrasound extraction feature signal 270 is also derived from the electrical response signal 235 (or capture data). The modified ultrasound extraction feature signal 270 comprises a Fourier transform of the electrical response signal 235 and then arranges the data plot to show a maximum frequency amplitude versus time based on the Fourier transform of the electrical response signal 235.

Overall, a set of forty-three (43) measurements corresponding with ultrasound extraction feature signals derived from the capture data or the electrical response signal 235 were found to be useful and in most instances worth evaluating to monitor an operating state of an energy storage device (e.g., a lithium-ion battery) during its lifetime. Measurements corresponding with ultrasound extraction feature signals can include, but are not limited to, time of flight through the device being monitored, time of zero crossing points, time of inflection points, time of primary, secondary, and tertiary positive and negative peak voltage points, and other time domain comparisons. Measurements corresponding with ultrasound extraction feature signals can further include voltage values of primary, secondary and tertiary positive and negative voltage peaks, voltage values inflection points, frequency bandwidth and selected frequency magnitudes, and differences in voltage amplitude or frequency magnitudes as compared with average or mean values, as compared with maximum and minimum values, or the like. In some embodiments, one, some, or all of the above listed ultrasound extraction feature signals derived from the capture data or from the electrical response signal 235 can be carried out and stored by the SDAS 150, and a feature matrix can be generated for evaluation by the data processor 195 or stored in memory 205 or both.

Characterization while Over-Charging

To test the feasibility of detecting deviations in the operating state of an LG1P-531A lithium-ion battery, a series of experiments were designed to purposely overcharge the test battery for at least some charging cycles at room temperature (RT) (e.g., about 23° C.) and at an Elevated Temperature (ET) (e.g., about 65° C.). Over-charge failure mechanisms were chosen to recreate internal battery failure mechanisms consistent with ESS in-field failures. Over-charge is known to cause rapid electrolyte degradation and outgassing, and the experiments were carried out to determine if changes in the battery state due to over-charging could be detected and characterized by ultrasound interrogation of the test battery during charging and discharging cycles that include over-charging the test battery.

A series of battery charging and discharging cycles included an initial series of normal charging and discharging cycles while collecting the same baseline data shown in FIGS. 5-6, followed by over-charging the test battery until the battery failed. The series of normal battery charging and discharging cycles was controlled by the battery cycling device described above. The battery cycling device was also utilized to collect the data corresponding with battery voltage, current, and battery temperature. The ultrasound interrogation data collected during the series of normal battery charging and discharging cycles was collected every 30 seconds by the ultrasound interrogation system. Over-charging the test battery until the battery failed was controlled by a potentiostat (VMP3 Potentiostat, sold by BioLogic Sciences Instruments, Seyssinet-Pariset, France). The potentiostat was configured to complete (a) CC over-charge at 400 mA without an upper voltage limit until the battery vented, or (b) CV overcharge at 5.5V.

Table 1 provides the battery CHARGE and DISCHARGE parameters of the battery cycler used to capture baseline data during the series of normal battery charging and discharging cycles, as well as the CC over-charge and CV over-charge parameters used to over-charge until battery failure. During the baseline cycling period, ultrasound captures were collected every two (2) minutes. During the over-charge until failure period, the ultrasound captures were collected every thirty (30) seconds.

TABLE 1

References battery cycling profile parameters.

| STEP | VOLTAGE LIMIT | CURRENT |
| --- | --- | --- |
| Charge | 4.2 V | 250 mA |
| Discharge | 2.5 V | 250 mA |
| CC overcharge | N/A | 400 mA |
| CV overcharge | 5.5 V | 5000 mA limit |

Table 2 lists nine (9) experiments/tests that were carried out and that included battery voltage and temperature data in the time domain and ultrasound capture data taken periodically. The data was stored in a memory. Data plots associated with selected tests of the tests are described below and some of the tests are reflected in the plots of FIGS. 7-10.

TABLE 2

Battery failure experiment list.

| TEST | TEMPERATURE | OVERCHARGE CONDITION |
| --- | --- | --- |
| 1 | RT | CC overcharge |
| 2 | RT | CC overcharge |
| 3 | RT | CV overcharge |
| 4 | RT | CV overcharge |

TABLE 2-continued

Battery failure experiment list.

| TEST | TEMPERATURE | OVERCHARGE CONDITION |
| --- | --- | --- |
| 5 | 65° C | CV overcharge |
| 6 | 65° C | CV overcharge |
| 7 | 65° C | CV overcharge |
| 8 | 65° C | CV overcharge |
| 9 | 65° C | CC overcharge |

Examples of Detection of Battery Failure Precursors and Early Warning

Figure 7:
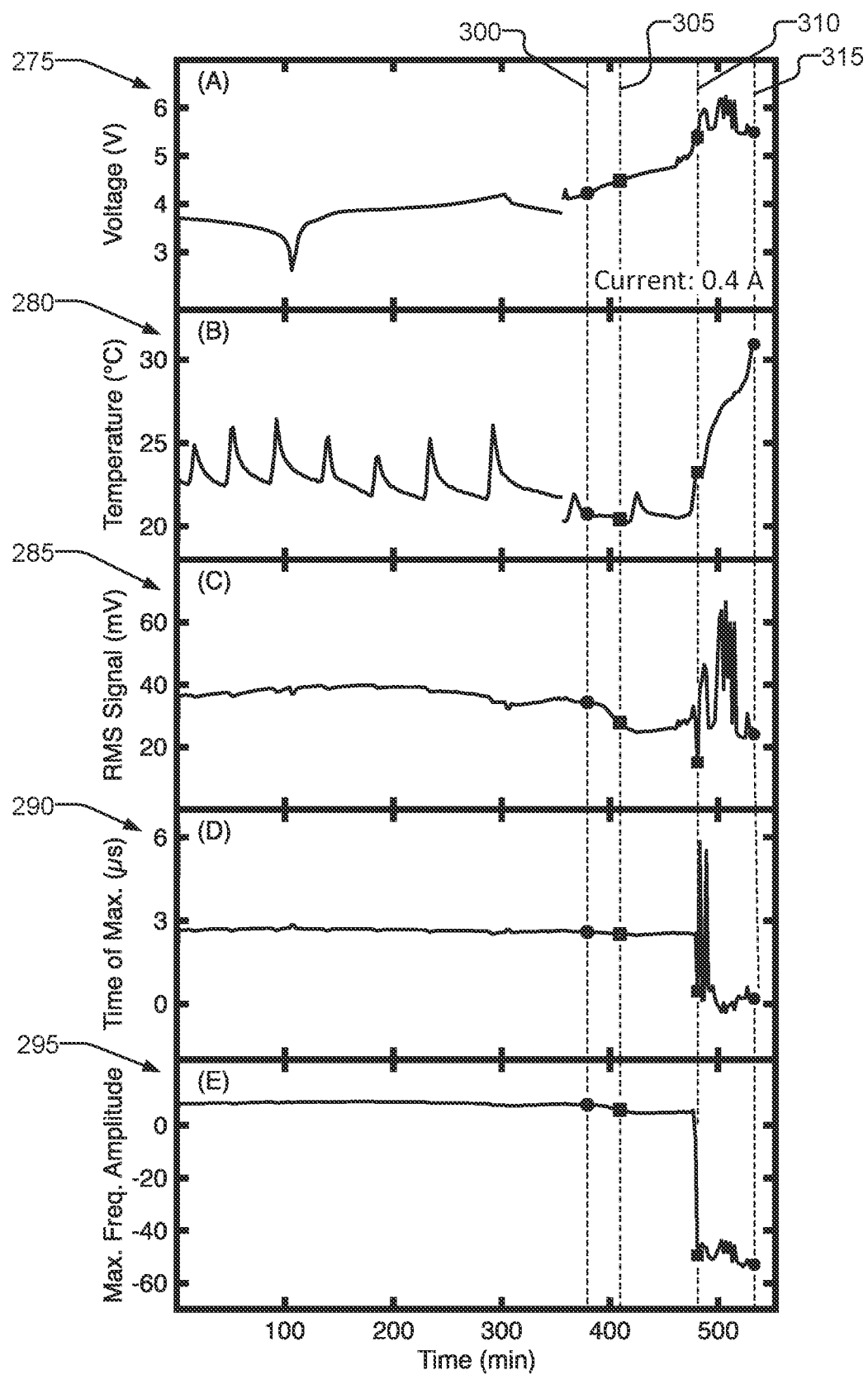
FIG. 7 depicts five graphical representations (A)-(E) of exemplary electrical signals, according to one or more embodiments of the disclosed subject matter. In the illustrated example, electrical signals (A) and (B) are associated with constant current over-charging cycling data at room temperature, in particular, where electrical signal (A) is an instantaneous voltage of the energy storage device over a plurality of charging and discharging cycles, and electrical signal (B) is associated with an instantaneous temperature of the energy storage device over the plurality of charging and discharging cycles. In the illustrated example, electrical signal (C) is associated with an ultrasound signal feature extraction example comprising a Root Mean Square of the electrical signal representative of the ultrasound energy exiting from the energy storage device, electrical signal (D) is associated with an ultrasound signal feature extraction example comprising a Hilbert transform of the electrical signal representative of the ultrasound energy exiting from the energy storage device, and electrical signal (E) is associated with an ultrasound signal feature extraction example comprising a Fourier transform of the electrical signal representative of the ultrasound energy exiting from the energy storage device.

FIG. 7 includes data plots of electrical signals associated with Test 1 listed in Table 2, with test parameters of RT with CC over-charge ("Test 1 CCRT"). In particular, FIG. 7 includes five graphical plots (A)-(E). Plot (A) shows a signal 275 of battery voltage versus time. Plot (B) shows a signal 280 of battery temperature versus time. Plot (C) shows a signal 285 of RMS values (in mV) versus time, achieved by converting voltage values of an electrical response signal to RMS voltage values. Plot (D) shows a signal 290 of the Hilbert transform of the electrical response signal arranged to identify the time (in µs) of the occurrence of maximum Hilbert transfer amplitude values. Plot (E) shows a signal 295 of a Fourier transform of the electrical response signal arranged to identify the time of occurrence of the Fourier transform maximum frequency amplitude values. In each of plots (A)-(E) of FIG. 7, the start of the over-charging is indicated at time 300 (e.g., prior to 400 min), an ultrasound warning notification is given at time 305 (e.g., just after 400 min), an E-Stop command is issued at time 310 (e.g., prior to 500 min), and a battery failure is indicated at time 315 (e.g., after 500 min).

Figure 8:
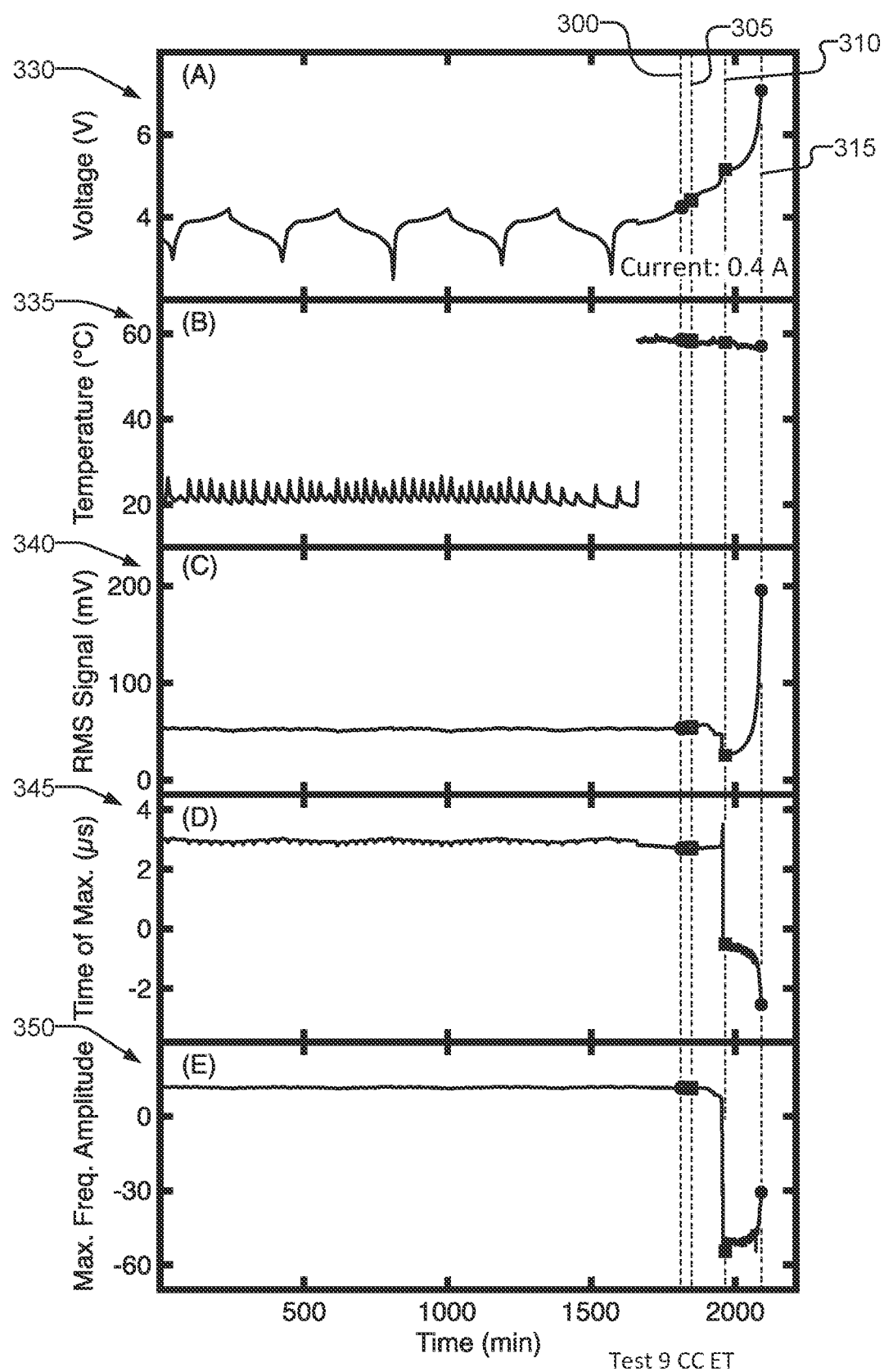
FIG. 8 depicts five graphical representations (A)-(E) of exemplary electrical signals, according to one or more embodiments of the disclosed subject matter. In the illustrated example, electrical signals (A) and (B) are associated with constant current over-charging cycling data at 65° C., in particular, where electrical signal (A) is an instantaneous voltage of the energy storage device over a plurality of charging and discharging cycles, and electrical signal (B) is associated with an instantaneous temperature of the energy storage device over the plurality of charging and discharging cycles. In the illustrated example, electrical signal (C) is associated with an ultrasound signal feature extraction example comprising a Root Mean Square of the electrical signal representative of the ultrasound energy exiting from the energy storage device, electrical signal (D) is associated with an ultrasound signal feature extraction example comprising a Hilbert transform of the electrical signal representative of the ultrasound energy exiting from the energy storage device, and electrical signal (E) is associated with an ultrasound signal feature extraction example comprising a Fourier transform of the electrical signal representative of the ultrasound energy exiting from the energy storage device.
Figure 9:
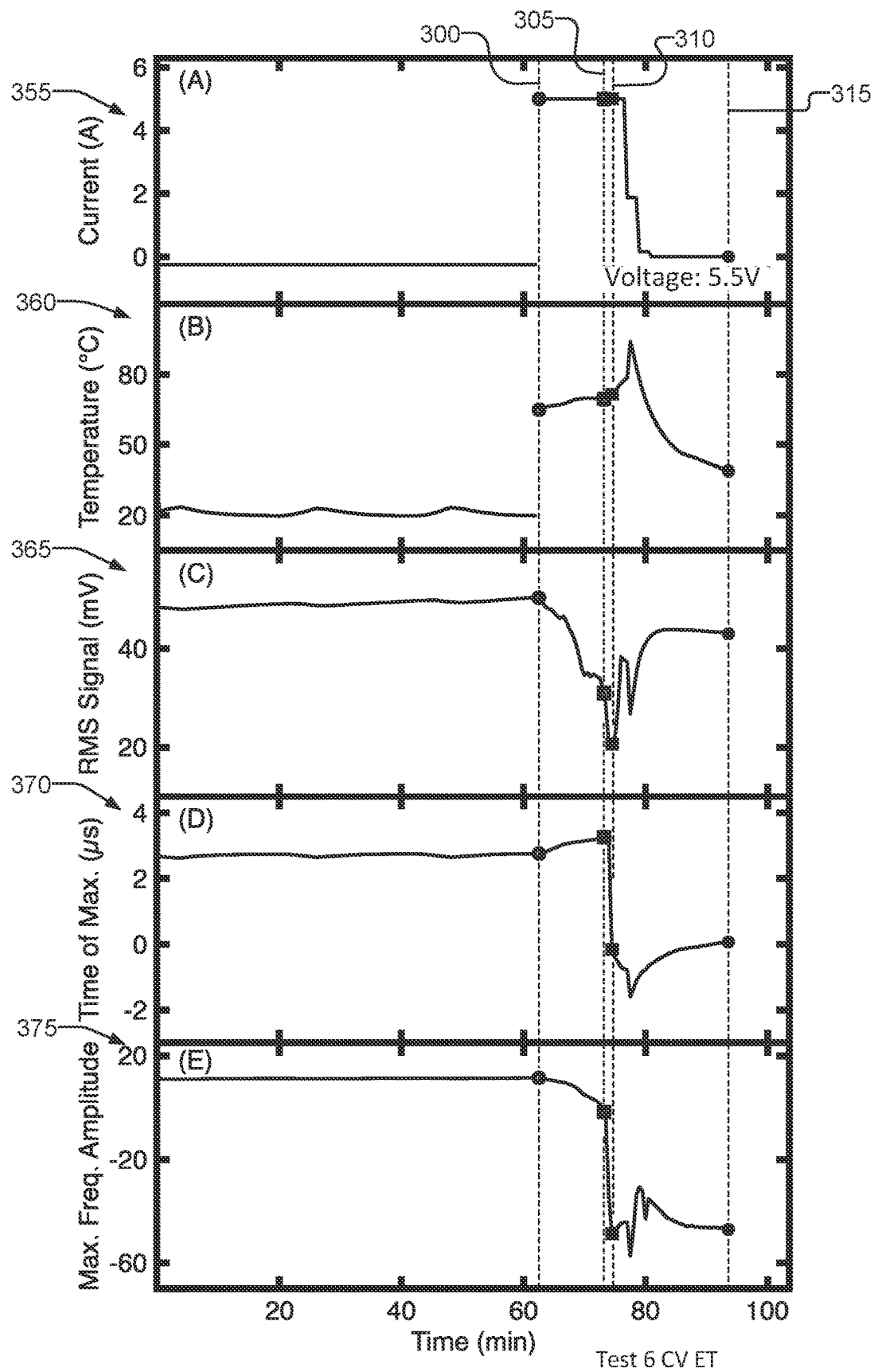
FIG. 9 depicts five graphical representations (A)-(E) of exemplary electrical signals, according to one or more embodiments of the disclosed subject matter. In the illustrated example, electrical signals (A) and (B) are associated with constant voltage over-charging cycling data at 65° C., in particular, where electrical signal (A) is an instantaneous voltage of the energy storage device over a plurality of charging and discharging cycles, and electrical signal (B) is associated with an instantaneous temperature of the energy storage device over the plurality of charging and discharging cycles. In the illustrated example, electrical signal (C) is associated with an ultrasound signal feature extraction example comprising a Root Mean Square of the electrical signal representative of the ultrasound energy exiting from the energy storage device, electrical signal (D) is associated with an ultrasound signal feature extraction example comprising a Hilbert transform of the electrical signal representative of the ultrasound energy exiting from the energy storage device, and electrical signal (E) is associated with an ultrasound signal feature extraction example comprising a Fourier transform of the electrical signal representative of the ultrasound energy exiting from the energy storage device.

FIG. 8 includes data plots of electrical signals associated with Test 9 listed in Table 2, with test parameters of ET with CC over-charge ("Test 9 CC ET"). In particular, FIG. 8 includes five graphical plots (A)-(E). Plot (A) shows a signal 330 of battery voltage versus time. Plot (B) shows a signal 335 of battery temperature versus time. Plot (C) shows a signal 340 of RMS values (in mV) versus time, achieved by converting voltage values of the electrical response signal to RMS voltage values. Plot (D) shows a signal 345 of the Hilbert transform of the electrical response signal arranged to identify the time (in µs) of the occurrence of maximum Hilbert transfer amplitude values. Plot (E) shows a signal 350 of the Fourier transform of the electrical response signal arranged to identify the time of occurrence of the Fourier transform maximum frequency amplitude values. In each of the plots (A)-(E) of FIG. 8, the start of the over-charging is indicated at time 300 (e.g., after 1500 min), an ultrasound warning notification is given at time 305 (e.g., after 1500 min), an E-Stop command is issued at time 310 (e.g., prior to 2000 min), and a battery failure is indicated at time 315 (e.g., after 2000 min). FIG. 9 includes data plots of electrical signals associated with Test 6 listed in Table 2, with test parameters of ET with CV over-charge ("Test 6 CV ET"). In particular, FIG. 9 includes five graphical plots (A)-(E). Plot (A) shows a signal 355 of battery current versus time. Plot (B) shows a signal 360 of battery temperature versus time. Plot (C) shows a signal 365 of RMS values (in mV) versus time, achieved by converting voltage values of the electrical response signal to RMS voltage values. Plot (D) shows a signal 370 of the Hilbert transform of the electrical response signal arranged to identify the time (in µs) of the occurrence of maximum Hilbert transfer amplitude values. Plot (E)

shows a signal 375 of the Fourier transform of the electrical response signal arranged to identify the time of occurrence of the Fourier transform maximum frequency amplitude values. In each of the plots (A)-(E) of FIG. 9, the start of the over-charging is indicated at time 300 (e.g., after 60 min), an ultrasound warning notification is given at time 305 (e.g., after ~70 min), an E-Stop command is issued at time 310 (e.g., prior to 80 min), and a battery failure is indicated at time 315 (e.g., prior to 100 min).

Figure 10:
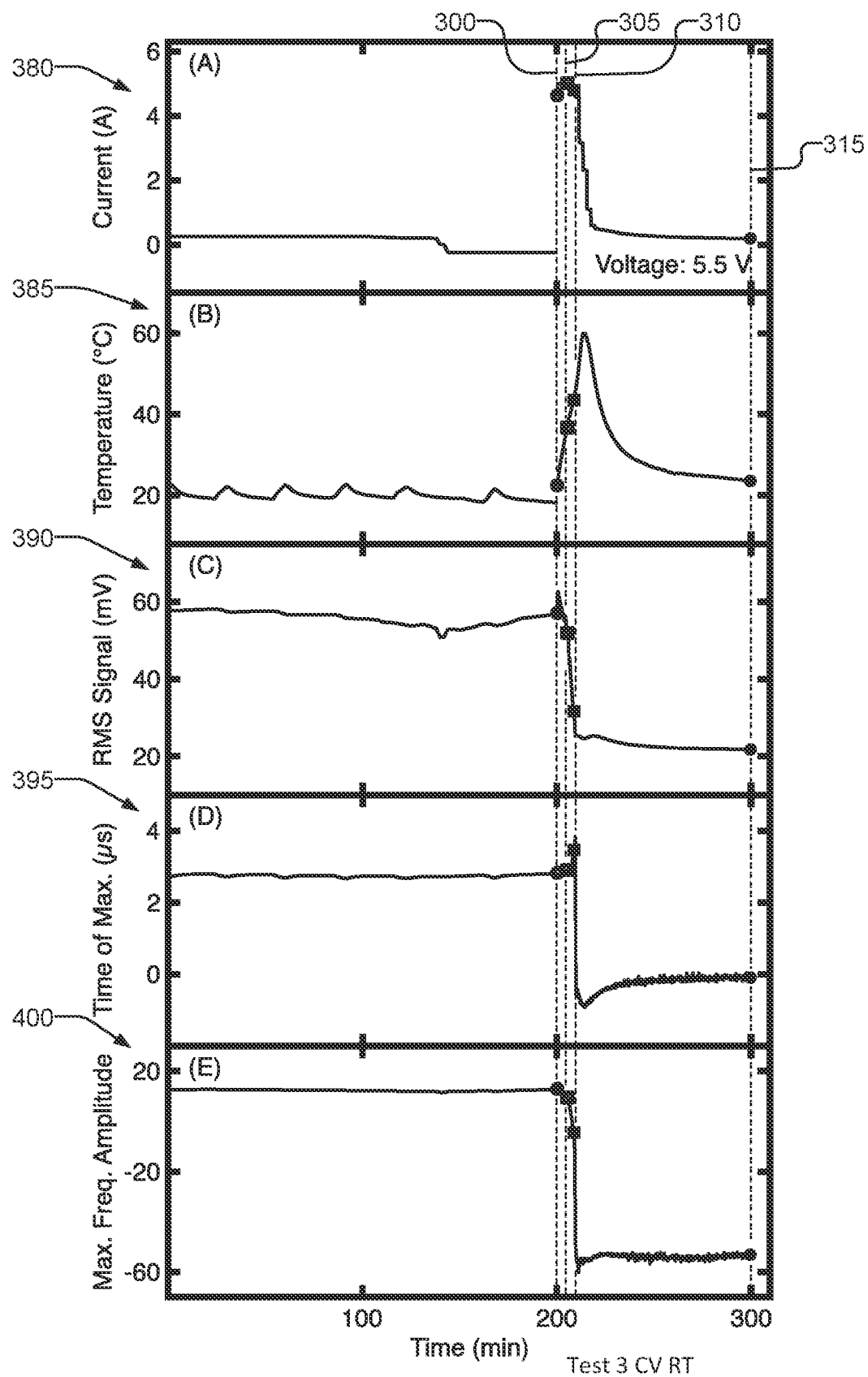
FIG. 10 depicts five graphical representations (A)-(E) of exemplary electrical signals, according to one or more embodiments of the disclosed subject matter. In the illustrated example, electrical signals (A) and (B) are associated with constant voltage over-charging cycling data at room temperature, in particular, where electrical signal (A) is an instantaneous voltage of the energy storage device over a plurality of charging and discharging cycles, and electrical signal (B) is associated with an instantaneous temperature of the energy storage device over the plurality of charging and discharging cycles. In the illustrated example, electrical signal (C) is associated with an ultrasound signal feature extraction example comprising a Root Mean Square of the electrical signal representative of the ultrasound energy exiting from the energy storage device, electrical signal (D) is associated with an ultrasound signal feature extraction example comprising a Hilbert transform of the electrical signal representative of the ultrasound energy exiting from the energy storage device, and electrical signal (E) is associated with an ultrasound signal feature extraction example comprising a Fourier transform of the electrical signal representative of the ultrasound energy exiting from the energy storage device.

FIG. 10 includes data plots of electrical signals associated with Test 3 listed in Table 2, with test parameters of RT with CV over-charge ("Test 3 CV RT"). In particular, FIG. 10 includes five graphical plots (A)-(E). Plot (A) shows a signal 380 of battery current versus time. Plot (B) shows a signal 385 of battery temperature versus time. Plot (C) shows a signal 385 of RMS values (in mV) versus time, achieved by converting voltage values of the electrical response signal to RMS voltage values. Plot (D) shows a signal 395 of the Hilbert transform of the electrical response signal arranged to identify the time (in µs) of the occurrence of maximum Hilbert transfer amplitude values. Plot (E) shows a signal 400 of the Fourier transform of the electrical response signal arranged to identify the time of occurrence of the Fourier transform maximum frequency amplitude values. In each of the plots (A)-(E) of FIG. 10, the start of the over-charging is indicated at time 300 (e.g., at ~200 min), an ultrasound warning notification is given at time 305 (e.g., after 200 min), an E-Stop command is issued at time 310 (e.g., at ~210 min), and a battery failure is indicated at time 315 (e.g., at ~300 min).

Exemplary Aspects of Ultrasound Interrogation Systems

Figure 11:
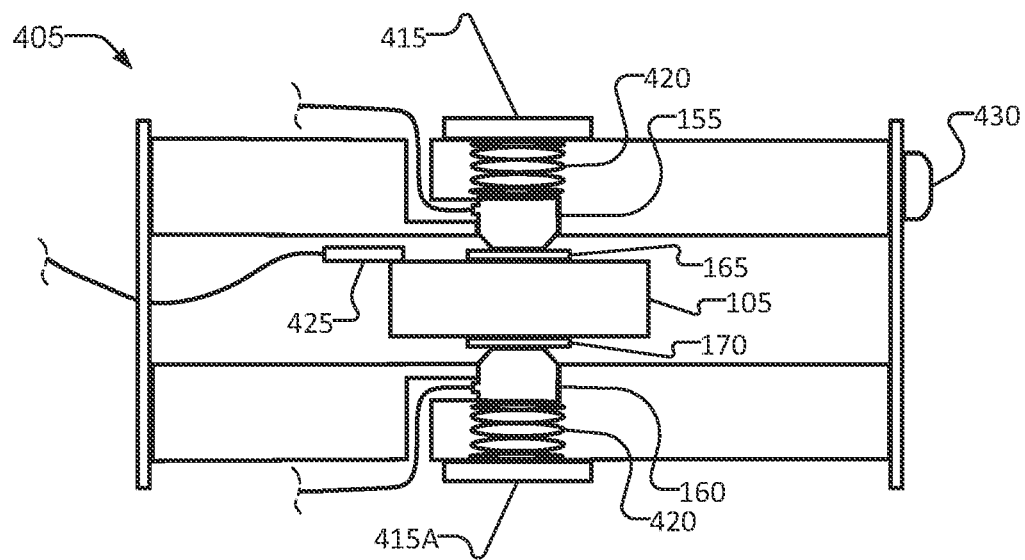
FIG. 11 is a simplified schematic diagram illustrating aspects of an exemplary testing setup for an ultrasound interrogation system, according to one or more embodiments of the disclosed subject matter. In the illustrated example, the ultrasound interrogation testing system is operable to transmit ultrasound energy into a single energy storage device during charging and discharging cycles, and to receive the ultrasound energy as it exits from the energy storage device for analysis by a processor.

FIG. 11 shows a non-limiting example of a testing setup for ultrasound interrogation, for example, a capture support device 405. The capture support device 405 can support a device under test 150 (e.g., a test battery, an energy storage device, or a housing containing the test battery or energy storage device therein) between an ultrasound emitter 155 and an ultrasound receiver 160. Alternative or additionally, in some embodiments, the ultrasound emitter 155 and/or the ultrasound receiver 160 can be replaced by a respective ultrasound transceiver, for example, to provide both ultrasound transmission and detection in a single unit disposed on one side of the battery. In some embodiments, one or both of the emitter 155 and the receiver 160 can be placed in intimate contact with (e.g., urged against) a facing surface of the device under test. In the illustrated example of FIG. 11, each of the ultrasound emitter 155 and an ultrasound receiver 160 is biased against the device under test 105 by a respective spring 420.

A backplate 415 can be releasably attached to the capture support device 405 and can be constructed to retain, support, and/or capture spring 420 between the ultrasound emitter 155 and a facing surface of the backplate 415. The spring 420 applies a biasing force that urges the ultrasound emitter 155 against a couplant 165 and also urges the couplant 165 against a surface of the device under test 105. Similarly, a second backplate 415A can be releasably attached to the capture support device 405 and can be constructed to retain, support, and/or capture spring 420 between the ultrasound receiver 160 and a facing surface of the second backplate 415A. The spring 420 applies a biasing force that urges the ultrasound receiver 160 against a couplant 170 and also urges the couplant 170 against an opposite surface of the device under test 105. In the illustrated example, a temperature sensor 425 is in contact with the device under test 105. For example, the temperature sensor 425 can be coupled to the device under test 105 via mechanical fixture (e.g., a separate positioner that places the sensor in contact with a surface of the device 105), a surface feature of the device 105 (e.g., a clip, plug, or recess constructed to releasably accept the sensor 425), and/or an adhesive. Alternatively or additionally, in some embodiments, temperature can be measured using a non-contact sensor, such as an infrared pyrometer or thermal imager.

Figure 12:
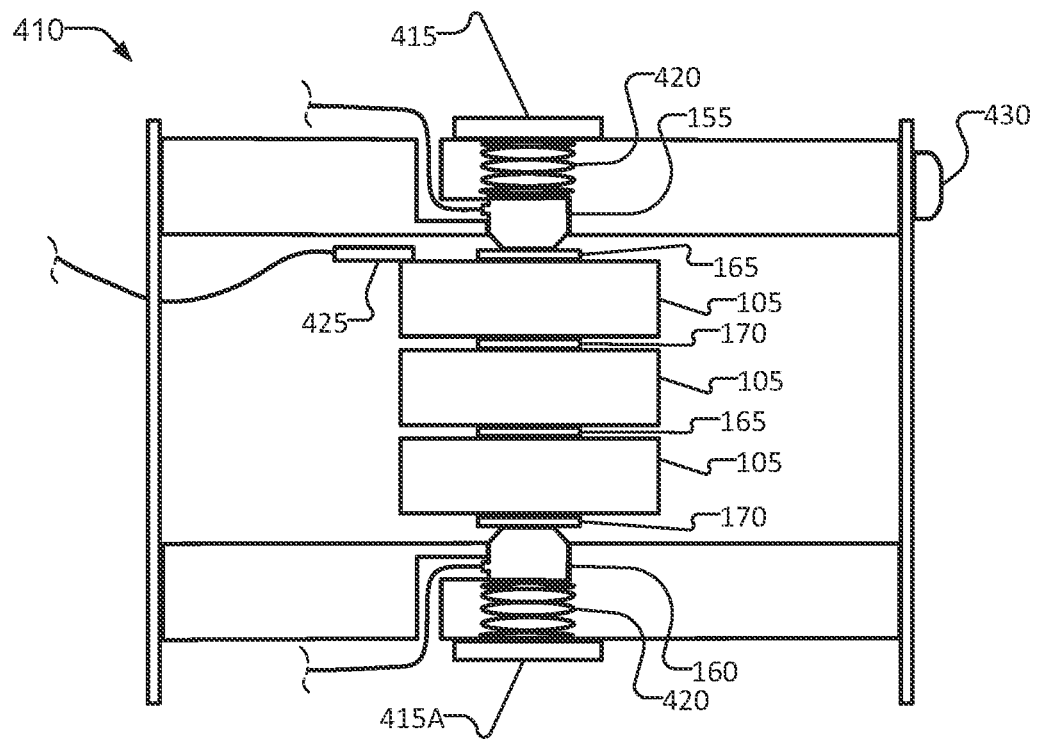
FIG. 12 is a simplified schematic diagram illustrating aspects of another exemplary testing setup for an ultrasound interrogation system, according to one or more embodiments of the disclosed subject matter. In the illustrated example, the ultrasound interrogation testing system is operable to transmit ultrasound energy into a plurality of energy storage devices during charging and discharging cycles of the plurality of energy storage devices, and to receive the ultrasound energy as it exits from the plurality of energy storage devices for analysis by a processor.

FIG. 12 shows another non-limiting example of a testing setup for ultrasound interrogation, for example, a capture support device 410. The capture support device 410 can supports three devices under test 105 (e.g., test batteries, energy storage devices, or a housing containing the test batteries or energy storage devices therein) between ultrasound emitter 155 and ultrasound receiver 160 for simultaneous interrogation. The ultrasound emitter 155 is biased against a surface of first of the three test batteries or energy storage devices 105 by a spring 420. Although FIG. 12 illustrates three devices 105, other numbers of devices (e.g., two or more) are also possible according to one or more contemplated embodiments.

A backplate 415 can be releasably attached to the capture support device 405 and can be constructed to retain, support, and/or capture spring 420 between the ultrasound emitter 155 and a facing surface of the backplate 415. The spring 420 applies a biasing force that urges the ultrasound emitter 155 against a couplant 165 and also urges the couplant 165 against a surface of a first of the three devices under test 105. Similarly, a second backplate 415A can be releasably attached to the capture support device 405 and can be constructed to retain, support, and/or capture spring 420 between the ultrasound receiver 160 and a facing surface of the second backplate 415A. The spring 420 applies a biasing force that urges the ultrasound receiver 160 against a couplant 170 and also urges the couplant 170 against a second of the three devices under test 105 (e.g., on an opposite side of the stack of three devices 105).

A third of the three devices under test 105 is sandwiched between facing surfaces of the first and the second devices under test. A first couplant 170 is sandwiched between facing surfaces of the first and third devices under test, and a second couplant 165 is sandwiched between surfaces of the second and third devices under test. The biasing force provided by each of the springs 420 urges all three devices under test against corresponding couplants with a biasing force. All three devices under test 105 can thus be acoustically coupled to each of the ultrasound emitter 155 and the ultrasound receiver 160.

In the illustrated example, a temperature sensor 425 is in contact with the first of the three devices under test 105. For example, the temperature sensor 425 can be coupled to the device under test 105 via mechanical fixture (e.g., a separate positioner that places the sensor in contact with a surface of the device 105), a surface feature of the device 105 (e.g., a clip, plug, or recess constructed to releasably accept the sensor 425), and/or an adhesive. However, the sensor 425 can be in thermal communication with any of the three devices under test 105. Alternatively or additionally, multiple temperature sensors 425 can be provided, for example, one for each of the devices under test 105. Alternatively or additionally, in some embodiments, temperature can be measured using a non-contact sensor, such as an infrared pyrometer or thermal imager.

Exemplary Warning or Alarm Systems

Figure 13:
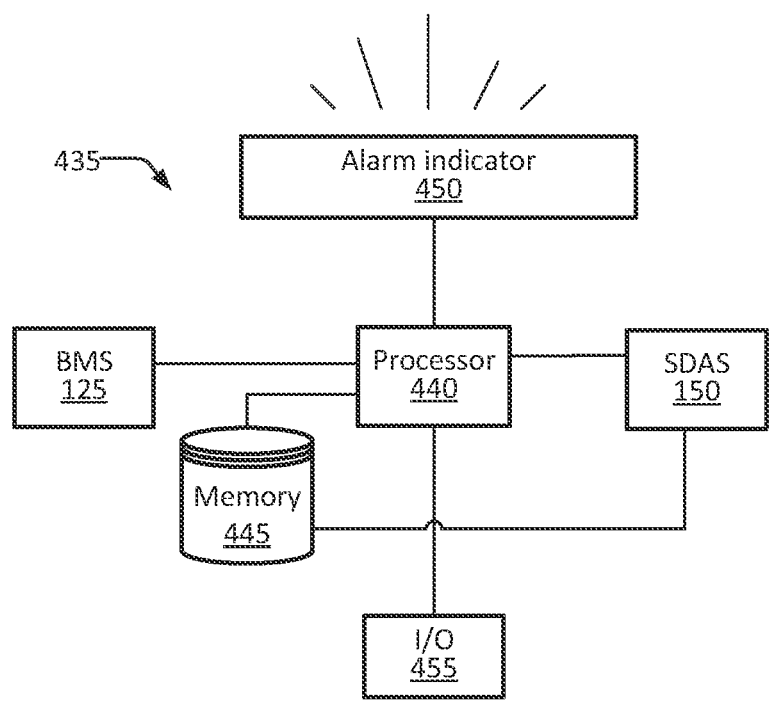
FIG. 13 is a simplified schematic diagram illustrating aspects of an exemplary system with an alarm indicator, according to one or more embodiments of the disclosed subject matter.

FIG. 13 shows a block diagram of an exemplary system 435 with alarm indicator (e.g., an alarm system module). The system 435 can comprise and/or be interfaced with BMS 125, SDAS 150, processor 440, memory module 445, and/or network interface or other data communication channel 455. When the processor 440 and/or SDAS 150 detects an abnormal operating state of an energy storage device, or otherwise detects a precursor to thermal runaway based on ultrasound signal characteristics, an alarm indicator 450 can be triggered. For example, when processor 440 performs an evaluation of an RMS signal (e.g., signal 285), Hilbert transform signal (e.g., signal 290), and/or Fourier transform signal (e.g., signal 295), such as by comparing to baseline data corresponding with any one of the signals and detecting a deviation from the baseline data, the processor 440 can be configured to trigger (e.g., by sending a command signal) alarm indicator 450.

In some embodiments, alarm triggering can be based on two different levels or thresholds. A first trigger level can be based on changes in RMS signal, Hilbert transform signal, and/or Fourier transform signal as compared to corresponding data that includes baseline signals or data points, data features, or combinations of data features derived from the baseline signals. For example, an alarm for the first trigger level can be initiated in response to RMS signal, Hilbert transform signal, and/or Fourier transform signal (or extractions from one or more of these signals) differ from corresponding baseline signals (or extractions thereof) stored in the memory, and the differences are statistically relevant but less than or equal to 10 standard deviations from baseline means.

Upon detecting a first trigger level difference (e.g., first threshold), the processor 440 instructs issuance of a first level warning/notification. In some embodiments, the first level warning/notification can include a digital notification (e.g., displayed on a display screen), activating an audio or visual alarm (e.g., by activating alarm indicator 450 or the like). Alternatively or additionally, the first level warning may trigger actions by the BMS 125, e.g., to identify which energy storage device caused the first level warning and/or to further evaluate the state of the energy storage device caused the first level warning by the BMS 125 or the like.

A second trigger level can be used to cease operation (or at least mitigate deleterious operation) of an energy storage device that may be at risk of imminent failure. Referred to herein as an E-stop command, this second level warning can be triggered when RMS signal, Hilbert transform signal, and/or Fourier transform signal (or extractions from one or more of these signals) differ from corresponding baseline signals (or extractions thereof) stored in the memory, and the differences are more than 10 standard deviations from baseline means.

Upon detecting an E-Stop trigger level difference (e.g., the second threshold), the processor 440 instructs issuance of a second level warning/notification. In some embodiments, the second level warning can includes determining (e.g., by the processor 440 and/or BMS 125) which energy storage device or devices caused the second level warning. In some embodiments, the system can then seek to isolate those energy storage devices from current sources and/or from power loads, for example, by selectively disconnecting the suspect energy storage devices from an external circuit (e.g., power source or load) and/or from other cells in an energy storage system. Alternatively or additionally, the second level warning may command isolation of all energy storage devices (e.g., not just the suspect device) from current sources and/or power loads.

Testing, Experimental Methods, and Baseline Data Collection

In Tests 1-9, time 300 (e.g., as illustrated in FIGS. 7-10) indicates the start of over-charging. In the case of CC over-charging, at time 300, the normal battery charging current of 250 mA increases to 400 mA, while the normal battery charging voltage is maintained at 4.2 V. The CC test data is associated with Tests 1 and 9, where Test 1 is carried out at RT and Test 9 is carried out at ET. The data that relates to Test 1 is presented in FIG. 7, and the data that relates to Test 9 is presented in FIG. 8. In the case of CV over-charging, at time 300, the voltage of the normal battery charging parameters of 4.2 V at 250 mA increased to 5.5 V with a maximum current limit of 5000 mA. The CV test data is associated with Tests 3 and 6, where Test 3 is carried out at RT and Test 6 is carried out at ET. The data that relates to Test 6 is presented in FIG. 9, and the data that relates to Test 3 is presented in FIG. 10.

During testing, prior to applying the overcharging parameters, each test battery was cycled by a battery cycler under normal cycling conditions within manufacturer specifications to establish an ultrasonic baseline, and then failure was induced on each test battery. As batteries were cycled, the SDAS (e.g., similar to SDAS 150) recorded through-transmission ultrasound signatures, and capture data during normal battery operation to establish a baseline with which to compare batteries undergoing failure. Data was also collected by the battery cycler, including time (e.g., timestamp and experimental time) versus test battery voltage, test battery current, and test battery capacity. Data collected by the SDAS includes time (e.g., timestamp), a through-transmission ultrasound capture, and test battery temperature measurements. Once all data was collected, the timestamps of the cycling data and SDAS data were paired such that each ultrasound capture and temperature had a unique voltage, current, maximum cycle capacity, and state of charge (SoC).

The input data was preprocessed by a data processor (e.g., similar to processor 195 in FIG. 1 or processor 440 in FIG. 13). In particular, data statistics were examined (e.g., change of SoC while cycling), and outlier signals were removed (e.g., if timing was offset or does not match the other ultrasonic pulses in the same capture). The ultrasound signals were then examined in the time domain (looking at direct transmission and internal reflection appearing later in the transmission signal) and different transformed domains (e.g., Fourier transform and Hilbert transform shown in FIG. 3-4). A set of forty-three (43) features were extracted from the time-series signals and transformed signals, and a feature matrix was generated.

To develop a detection method, two data sets were considered: (1) the baseline data set, where a battery operates under normal conditions; and (2) an over-charging data set, where the battery is purposely operated outside normal cycling parameters and specifically when the test battery is being over-charged. Features of the baseline data set were reviewed to determine how the features of the baseline data set change in response to a series of normal battery charging and discharging cycles. One feature each from the electrical response signal (e.g., signal 235 in FIG. 1), the Fourier transform of the time series signal (e.g., signal 245 in FIG. 3), and the Hilbert transform (e.g., signal 240 in FIG. 2) of the time series signal was used for analysis that cycled consistently with each test battery, thereby resulting in three (3) ultrasound features in total. FIG. 6 shows an example of baseline cycling and the resulting changes in the three ultrasound features. There are no significant changes in signals over time. However, each of the features does change with the SoC and temperature.

Once the baseline signals and derived features were reviewed for all experiments, the data of the induced failures were analyzed for comparison. Over-charge failure mechanisms were chosen to recreate internal failure mechanisms consistent with ESS in-field failures. For example, inducing over-charge is known to cause rapid electrolyte degradation and outgassing. Signal changes during induced failure were analyzed in the context of the baseline cycling data. In other words, all observations of signal changes during failure should differ significantly from the signal changes during normal cycling.

Since temperature impacts ultrasound and five of the failure experiments were performed at an elevated temperature (e.g., in a high temperature chamber), the signal features were corrected such that the changes in ultrasound features were temperature compensated. The effect of temperature on ultrasound is apparent in some baseline data in which a change in mean temperature resulted in a slight change in the time series and transform features. To compensate for temperature, two batteries were cycled at room temperature and then moved to an oven to cycle at high temperature. Features were calculated for approximately five cycles in the two environments. Eqn. 1 below shows the relationship used to compensate for temperature differences:

$$F_{i,High\ T} \times T_{High\ T}(°C.) = F_{i,RT} \times T_{Low\ RT} \text{const.} \quad (1)$$

where $F_i$ is a feature at either high (High T) or room temperature (RT), T is the average temperature of the set of five cycles (either high or low temperature), and const. is an experimentally determined constant.

The introduction of abnormal conditions based on the cycler measurements of current and voltage was designated as over-charge beginning at time 300, as indicated in FIGS. 7-10. Time 300 is the earliest time the ultrasound signals should deviate from normal because of battery degradation. Therefore, to minimize the number of false positive reports, all failure detection was interpreted as occurring after the over-charge had started at time 305. To analyze the changes in the ultrasound feature extractions, several metrics of the baseline data were compared to the same metrics of failure data of a given test:

Feature range: The range of the magnitude of the feature was calculated for all baseline data prior to the start of the overcharge and compared to magnitude during overcharge. In this instance, the range of magnitude relates a comparison between the baseline data described in FIGS. 5-6 and the characterizing data and over-charge data corresponding with any of the tests listed in Table 2 and shown in the example plots of FIGS. 7-10.

Rate of change of feature magnitude: The rate of change of a feature with various numbers of previous points was calculated for all reference data (e.g., three previous points to calculate a slope versus five). The extremes of these calculations were used to determine normal variability and were compared to the same rate of change when over-charge began.

Deviation from a mean by 10 standard deviations: The mean and standard deviation were calculated for all baseline data prior to overcharge. Magnitude change of a feature by 10 standard deviations from the mean was outside all reference data and was noted as a criterion for an emergency stop during overcharge.

Once the start of a test battery failure was identified, a detection method for deviations of the three ultrasound extraction features was created based on the above metrics. Detection of a potential test battery failure includes two types of notifications:

(1) A warning notification, which occurred at a time indicated at reference number 305 (shown in each of FIGS. 7-10). The warning notification from the ultrasound system can be associated with a time when at least one of the three ultrasound extraction features begins to deviate from baseline cycling behavior as determined by a change in absolute magnitude (e.g., either increasing or decreasing) and/or by the rate of change of at least one of the three ultrasound extraction features. The warning notification does not indicate that the battery has reached a point of imminent failure, but rather that conditions suggest further monitoring is desirable and/or that failure is possible.

(2) An Emergency Stop or E-stop command, which occurred at a time indicated by reference number 310 (shown in each of FIG. 7-10). The E-stop command can be executed (e.g., by the ultrasound system 100, by BMS 125, and/or by alarm system module 435) when significant changes in at least one of the three ultrasound extraction features indicate that the battery is on course for imminent catastrophic failure (e.g., when one or more measured data points varies from a corresponding baseline data point by ten (10) standard deviations from the baseline mean). In some embodiments, an E-stop notification prompts the SDAS (e.g., SDAS 150) or the BMS (e.g., BMS 125) to open the circuit to the test battery and/or to stop current flow.

In an exemplary CC over-charge test, the over-charge start time 300 was marked when the battery voltage went above 4.2 V (voltage limit in baseline cycling experiments). A warning was issued 130 min before the battery failure at the end of the test. This coincides with a faster rate of change of the time series and Hilbert transform features compared to the baseline. A change in one of the three signals was determined to differ by ten (10) standard deviations from the baseline mean of that signal, 54 minutes before the test battery failed. In response to detecting that the signal change was ten (10) standard deviations from the baseline mean, an alarm system module can trigger the E-stop notification/command at time 310, which when active causes a cessation of current to the battery. Here, however, the over-charging test was allowed to continue until the test battery failed. The CC over-charge test ended with a test battery failure consisting of the battery ballooning and eventually venting.

FIGS. 9-10 show data plots associated with failure detection because of CV over-charge, at ET in FIG. 9 and at RT in FIG. 10. The beginning of the overcharge is marked as over-charge start time 300, which coincides with the time the current spiked to its maximum 5 A to bring the battery voltage to 5.5 V. In FIG. 9, the current spike coincided with a sudden drop in the RMS signal 365 and with dramatic changes in ultrasound signal features 370 and 375. A warning was issued at time 305 and shortly thereafter an E-stop command at time 310 was detected. In FIG. 10, the current spike coincided with a sudden warning notification that was issued at time 305, quickly followed by an E-stop command at time 310.

FIG. 7 is associated with Test 1 and FIG. 8 is associated with Test 9. FIG. 7 shows data plots associated with the ability of the ultrasound interrogation system to detect battery failure because of CC over-charge at RT, while FIG. 8 shows data plots associated with the ability of the system to detect battery failure due to CC over-charge at ET. In FIG. 7, the beginning of the overcharge is marked as over-charge start time 300, which coincides with the time the charging current spiked to its maximum value of 400 mA at 4.2 V. The current spike coincided with a sudden drop in the RMS signal 285 and with smaller changes in ultrasound signal features 290 and 295. A warning notification was issued at time 305, about 130 minutes before test battery failure. The warning was followed by an increase in the RMS signal 285 with even smaller changes in ultrasound signal features 290 and 295. An E-stop command was issued at time 310, about 54 minutes before test battery failure in response to a sudden dramatic and simultaneous drop in all three ultrasound signal features.

In FIG. 8, the beginning of the over-charge is marked as over-charge start time 300, which coincides with the time the charging current spiked to its maximum 400 mA at 4.2 V. A warning notification was issued at time 305, almost immediately following the over-charge start time 300, about 183 minutes before test battery failure. The warning notification was issued without much change in any of the three ultrasound signal features 340, 345, 350. An E-stop command was issued at time 310, 142 minutes before test battery failure. The E-stop command was issued (e.g., by the alarm system module, such as module 435) in response to a sudden dramatic and simultaneous drop that the ultrasound system (e.g., system 100) detected in all three ultrasound signal features.

Review of Experimental Results

FIGS. 7-10 show data plots corresponding with Tests 1, 3, 6, and 9, as described above. Data relating to overcharging of all batteries to failure for each of Tests 1-9 is listed below in Table 3. In particular, Table 3 provides a summary of each experiment and the response time for the warning notification and E-stop command compared to the total time of failure. Warning before failure time indicates the amount of time between catastrophic failure event and ultrasound warning detected. The E-stop before failure time indicates the amount of time prior to catastrophic failure. Note that the Global Technical Regulation on Electric Vehicle Safety requires a 5-minute warning of battery failure.

TABLE 3

Failure Detection Times.

| INCLUDED TEST FAILURE | WARNING BEFORE FAILURE | E-STOP BEFORE FAILURE | TIME FROM OVER-CHARGING TO FAILURE |
|---|---|---|---|
| 1 RT CC-overcharge | 124 min (81%) | 54 min (35%) | 154 min |
| 2 RT CC-overcharge | 90 min (66%) | 90 min (66%) | 136 min |
| 3 RT CV-overcharge | 93 min (93%) | 92 min (92%) | 100 min |
| 4 RT CV-overcharge | 348 min (99%) | 347 min (99%) | 352 min |
| 5 ET CV-overcharge | 21 min (84%) | 15 min (60%) | 25 min |
| 6 ET CV-overcharge | 20 min (65%) | 19 min (61%) | 31 min |
| 7 ET CV-overcharge | 12 min (75%) | 4 min (25%) | 16 min |
| 8 ET CV-overcharge | 76 min (50%) | 58 min (38%) | 151 min |
| 9 ET CV-overcharge | 285 min (99%) | 139 min (48%) | 289 min |

Referring to the data for test 6 shown in FIG. 9 and Table 3, the test energy storage device was being over-charged at CV and ET. A first ultrasound warning notification was issued at time 305, about 11 minutes after the start of over-charging. The first ultrasound warning time 305 is 20 minutes before eventual battery failure. An E-stop command was issued at time 310, or about 12 minutes after the start of over-charging time 300 and about 19 minutes before battery failure. The total warning time between the over-charge start time 300 and the battery failure time 315 was about 31 minutes.

The ultrasound interrogation system described herein can be equipped to monitor a single energy storage device (e.g., liquid electrolyte batteries, such as lithium-ion batteries) or a plurality of energy storage devices, and to detect precursors to potentially hazardous operating states thereof. FIG. 5 provides an example of generating and storing baseline data measured by a battery cycler over a series of charging and discharging cycles of an energy storage device type or model. FIG. 6 provides baseline ultrasound feature data captured by the ultrasound interrogation system during the same series of charging and discharging cycles. Thus, ultrasound interrogation system is equipped to store data sets or feature extractions of data sets that correspond with data collected during normal charging and discharging cycles of one or more energy storage device types or models.

The ultrasound interrogation system can be further operable to electrically interface with the energy storage device(s) and to manage the energy storage device(s) to receive power or energy from a source and/or to deliver power or energy to a power load. The ultrasound interrogation system can be further operable to monitor characteristics of the energy storage device(s) during operation and management thereof. The characteristics of the energy storage device(s) can include at least device temperature, device voltage, device current, and/or device resistance. The ultrasound interrogation system can be further operable to mechanically interface an ultrasound interrogation module with the energy storage device(s), to transmit ultrasound energy into and through the energy storage device(s), and/or to receive the transmitted ultrasound energy exiting from the energy storage device(s), for example, while the energy storage device(s) is receiving power or energy from a source, delivering power or energy to a load, storing electrical energy, or any combination of the foregoing.

The ultrasound interrogation system can be further operable to capture an electrical response signal responsive to ultrasound energy exiting from the energy storage device(s) while the energy storage device(s) and the BMS are operating. The ultrasound interrogation system can be further operable to store or capture electrical response signal in its memory and to generate ultrasound extraction signals while the energy storage device and the BMS are operating. Moreover, the ultrasound interrogation system can be further operable to compare the ultrasound extraction signals with baseline data sets stored in its memory and further operable to detect precures to potentially hazardous operating states of the energy storage device being managed when the comparison of ultrasound extraction signals of the operating energy storage device disagrees with the baseline data sets stored in its memory.

The ultrasound interrogation system can be further operable to generate one or more warnings and/or to autonomously disconnect the battery being managed from a current source when precursors to potentially hazardous operating states of the energy storage device being managed are detected, for example, by comparison with baseline data sets stored in its memory or when an operating state of the energy storage device being managed is inconsistent with baseline data sets stored in its memory.

Computer Implementation

Figure 14:
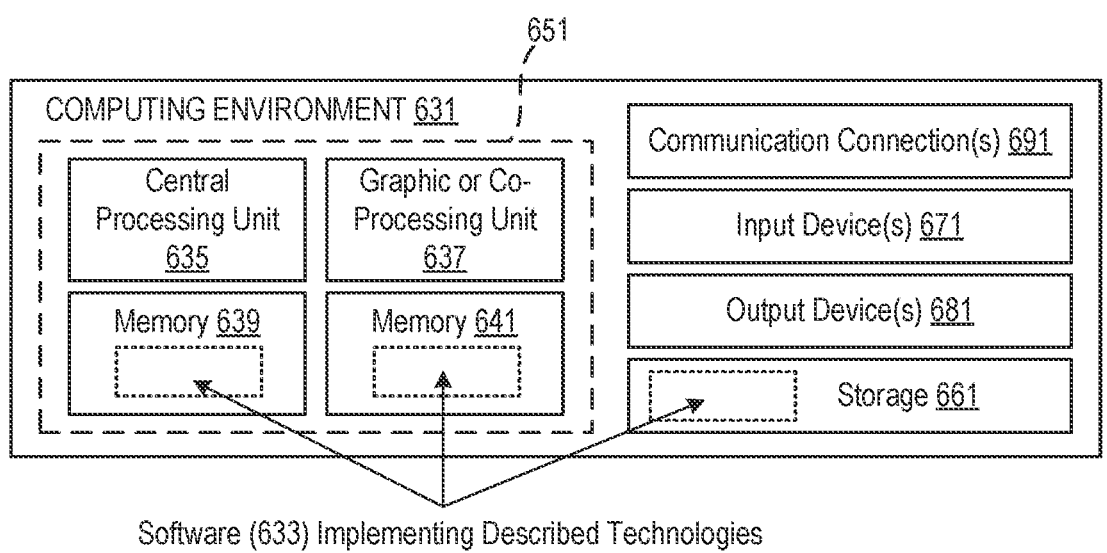
FIG. 14 depicts a generalized example of a computing environment in which the disclosed technologies may be implemented.

FIG. 14 depicts a generalized example of a suitable computing environment 631 in which the described innovations may be implemented, such as aspects of the ultrasound interrogation method described herein, the multi-level alarm indication described herein, SDAS 150, BMS 125, and/or alarm system module 435. The computing environment 631 is not intended to suggest any limitation as to scope of use or functionality, as the innovations may be implemented in diverse general-purpose or special-purpose computing systems. For example, the computing environment 631 can be any of a variety of computing devices (e.g., desktop computer, laptop computer, server computer, tablet computer, etc.).

With reference to FIG. 14, the computing environment 631 includes one or more processing units 635, 637 and memory 639, 641. In FIG. 14, this basic configuration 651 is included within a dashed line. The processing units 635, 637 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 14 shows a central processing unit 635 as well as a graphics processing unit or co-processing unit 637. The tangible memory 639, 641 may be volatile memory (e.g., registers, cache, RAM), non-volatile memory (e.g., ROM, EEPROM, flash memory, etc.), or some combination of the two, accessible by the processing unit(s). The memory 639, 641 stores software 633 implementing one or more innovations described herein, in the form of computer-executable instructions suitable for execution by the processing unit(s).

A computing system may have additional features. For example, the computing environment 631 includes storage 661, one or more input devices 671, one or more output devices 681, and one or more communication connections 691. An interconnection mechanism (not shown) such as a bus, controller, or network interconnects the components of the computing environment 631. Typically, operating system software (not shown) provides an operating environment for other software executing in the computing environment 631, and coordinates activities of the components of the computing environment 631.

The tangible storage 661 may be removable or non-removable, and includes magnetic disks, magnetic tapes or cassettes, CD-ROMs, DVDs, or any other medium which can be used to store information in a non-transitory way, and which can be accessed within the computing environment 631. The storage 661 can store instructions for the software 633 implementing one or more innovations described herein.

The input device(s) 671 may be a touch input device such as a keyboard, mouse, pen, or trackball, a voice input device, a scanning device, or another device that provides input to the computing environment 631. The output device(s) 671 may be a display, printer, speaker, CD-writer, or another device that provides output from computing environment 631.

The communication connection(s) 691 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, radio-frequency (RF), or another carrier.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, aspects of the disclosed technology can be implemented by software written in C++, Java, Perl, any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means. In any of the above-described examples and embodiments, provision of a request (e.g., data request), indication (e.g., data signal), instruction (e.g., control signal), or any other communication between systems, components, devices, etc. can be by generation and transmission of an appropriate electrical signal by wired or wireless connections.

Additional Examples of the Disclosed Technology

In view of the above-described implementations of the disclosed subject matter, this application discloses the additional examples in the clauses enumerated below. It should be noted that one feature of a clause in isolation, or more than one feature of the clause taken in combination, and, optionally, in combination with one or more features of one or more further clauses are further examples also falling within the disclosure of this application.

Clause 1. A battery system failure detection method comprising:
  detecting ultrasound energy signal changes corresponding with an operating battery;
  comparing the detected signal changes with battery signal changes previously observed during one or more battery failure modes; and
  terminating operation of the battery when the detected signal changes have characteristics of the battery signal changes previously observed during the one or more battery failure modes.

Clause 2. The method of any clause or example herein, in particular, Clause 1, wherein the detecting is performed by an ultrasound interrogation system of a battery management system for the battery.

Clause 3. The method of any clause or example herein, in particular, any one of Clauses 1-2, wherein the comparing is performed by a battery management system for the battery.

Clause 4. The method of any clause or example herein, in particular, any one of Clauses 1-3, wherein the terminating is performed by a battery management system for the battery.

Clause 5. The method of any clause or example herein, in particular, any one of Clauses 2-4, further comprising controlling, via the battery management system, charging or discharging of the battery.

Clause 6. The method of any clause or example herein, in particular, any one of Clauses 2-5, wherein the battery signal changes previously observed during the one or more battery failure modes are stored by the battery management system.

Clause 7. The method of any clause or example herein, in particular, any one of Clauses 2-6, wherein the terminating comprises sending a signal that causes disconnection of the battery from a current source, a voltage source, a load, other batteries, or any combination of the foregoing.

Clause 8. The method of any clause or example herein, in particular, any one of Clauses 1-7, wherein the battery signal changes observed during one or more battery failure modes are derived from ultrasound signatures of a plurality of batteries during a plurality of charge and discharge cycles.

Clause 9. The method of any clause or example herein, in particular, any one of Clauses 1-8, wherein the battery signal changes correspond with a battery voltage, a battery current measurement, a battery temperature, or any combination of the foregoing.

Clause 10. A method comprising:
  (a) detecting ultrasound transmitted through and/or reflected from an interior of a battery during charging or discharging thereof; and
  (b) based at least in part on the detected ultrasound satisfying one or more predetermined thresholds, providing an indication of battery fault.

Clause 11. The method of any clause or example herein, in particular, Clause 10, wherein (b) comprises providing an indication of potential failure of the battery based at least in part on the detected ultrasound satisfying a first threshold.

Clause 12. The method of any clause or example herein, in particular, Clause 11, wherein the first threshold is a first deviation of one or more features extracted from a detected ultrasound signal and/or a value for a rate of change of the one or more extracted features, as compared to a baseline extracted feature value obtained during normal operation of the battery.

Clause 13. The method of any clause or example herein, in particular, Clause 12, wherein the one or more features comprises a feature extracted from a time series signal, a feature extracted from a Fourier Transform, a feature extracted from a Hilbert Transform, or any combination thereof.

Clause 14. The method of any clause or example herein, in particular, any one of Clauses 10-13, wherein (b) comprise providing an indication of impending failure of the battery based at least in part on the detected ultrasound satisfying a second threshold.

Clause 15. The method of any clause or example herein, in particular, Clause 14, wherein the indication of impending failure is effective to terminate operation of the battery prior to catastrophic failure thereof.

Clause 16. The method of any clause or example herein, in particular, any one of Clauses 14-15, wherein the second threshold is a second deviation of one or more features extracted from a detected ultrasound signal as compared to a baseline extracted feature value obtained during normal operation of the battery.

Clause 17. The method of any clause or example herein, in particular, Clause 16, wherein the one or more features comprises a feature extracted from a time series signal, a feature extracted from a Fourier Transform, a feature extracted from a Hilbert Transform, or any combination thereof.

Clause 18. The method of any clause or example herein, in particular, any one of Clauses 14-17, wherein the first threshold is different than the second threshold.

Clause 19. A failure detection system comprising:
  one or more processors; and
  computer readable storage media storing computer-readable instructions that, when executed by the one or more processors, cause the one or more processors to:
    extract at least one feature of a detected ultrasound signal from a battery; and
    generate one or more signals that indicate a battery fault in response to one or more of the extracted features satisfying one or more thresholds.

Clause 20. The system of any clause or example herein, in particular, Clause 19, wherein the computer-readable instructions, when executed by the one or more processors, cause the one or more processors to generate the one or more signals by generating a first signal in response to one or more of the extracted features satisfying a first threshold, the first signal providing an indication of potential failure of the battery.

Clause 21. The system of any clause or example herein, in particular, Clause 20, wherein the at least one feature comprises a feature extracted from a time series signal, a feature extracted from a Fourier Transform, a feature extracted from a Hilbert Transform, or any combination thereof.

Clause 22. The system of any clause or example herein, in particular, any one of Clauses 19-21, wherein the computer-readable instructions, when executed by the one or more processors, cause the one or more processors to generate the one or more signals by generating a second signal in response to one or more of the extracted features satisfying a second threshold, the second signal providing an indication of impending failure of the battery.

Clause 23. The system of any clause or example herein, in particular, Clause 22, wherein the second signal is effective to terminate operation of the battery prior to catastrophic failure thereof.

Clause 24. The system of any clause or example herein, in particular, any one of Clauses 22-23, wherein the at least one feature comprises a feature extracted from a time series signal, a feature extracted from a Fourier Transform, a feature extracted from a Hilbert Transform, or any combination thereof.

Clause 25. A system for managing one or more energy storage devices during operations comprising:
a battery management system configured to manage charging or discharging of each of the one or more energy storage devices;
an ultrasound interrogation system electrically interfaced with the battery management system and configured to pass ultrasound energy through the one or more energy storage devices during the charging or discharging thereof;
a data memory configured to store (i) a capture data instance derived from ultrasound energy exiting the one or more energy storage devices and (ii) baseline ultrasound data corresponding with the one or more energy storage devices during the charging or discharging thereof; and
a data processor in communication with the data memory, the data processor being configured to:
compare each capture data instance with the baseline ultrasound data; and
detect, based at least in part on the comparison, an abnormal operating state of any of the one or more energy storage devices during the charging/discharging thereof.

Clause 26. The system of any clause or example herein, in particular, Clause 25, wherein the ultrasound interrogation system is configured to pass ultrasound energy through each of the one or more energy storage devices during the charging or discharging thereof.

Clause 27. The system of any clause or example herein, in particular, any one of Clauses 25-26, further comprising:
an alarm system module operatively coupled to the data processor,
wherein the alarm system module is configured to issue an initial warning notification when an operating state of any one of the energy storage devices is determined to exhibit an operating state characteristic that differs from a normal operating state characteristic corresponding with the baseline ultrasound data.

Clause 28. The system of any clause or example herein, in particular, Clause 27, wherein:
the alarm system module is further configured to issue an E-Stop command to at least one of the one or more energy storage devices when the ultrasound capture data instance is determined, by the data processor, to exhibit a precursor to thermal runaway, and
the E-stop command causes autonomous isolation of said at least one of the one or more energy storage devices from any current sources.

Clause 29. A system comprising one or more processors and non-transitory computer readable storage media storing computer-readable instructions that, when executed by the one or more processors, cause the one or more processors to perform the method of any clause or example herein, in particular, any one of Clauses 1-18.

Conclusion

Any of the features illustrated or described herein, for example, with respect to FIGS. 1-14 and Clauses 1-29, can be combined with any other feature illustrated or described herein, for example, with respect to FIGS. 1-14 and Clauses 1-29 to provide systems, devices, methods, and embodiments not otherwise illustrated or specifically described herein. Indeed, all features described herein are independent of one another and, except where structurally impossible, can be used in combination with any other feature described herein. In view of the many possible embodiments to which the principles of the disclosed technology may be applied, it should be recognized that the illustrated embodiments are only examples and should not be taken as limiting the scope of the disclosed technology. Rather, the scope is defined by the following claims. We therefore claim all that comes within the scope and spirit of these claims.

The invention claimed is:

1. A battery system failure detection method comprising:
detecting ultrasound energy signal changes corresponding with an operating battery;
comparing the detected ultrasound energy signal changes with battery ultrasound energy signal changes previously observed during one or more battery failure modes; and
terminating operation of the battery when the detected ultrasound energy signal changes have characteristics of the battery ultrasound energy signal changes previously observed during the one or more battery failure modes.

2. The method of claim 1, wherein:
the detecting is performed by an ultrasound interrogation system of a battery management system for the battery;
the comparing is performed by the battery management system for the battery;
the terminating is performed by the battery management system for the battery; or
any combination of the above.

3. The method of claim 2, further comprising controlling, via the battery management system, charging or discharging of the battery.

4. The method of claim 2, wherein the battery ultrasound energy signal changes previously observed during the one or more battery failure modes are stored by the battery management system.

5. The method of claim 1, wherein the terminating comprises sending a signal that causes disconnection of the battery from a current source, a voltage source, a load, other batteries, or any combination of the foregoing.

6. The method of claim 1, wherein the battery ultrasound energy signal changes observed during one or more battery failure modes are derived from ultrasound signatures of a plurality of batteries during a plurality of charge and discharge cycles.

7. The method of claim 1, wherein the battery ultrasound energy signal changes correspond with a battery voltage, a battery current measurement, a battery temperature, or any combination of the foregoing.

8. A method comprising:
(a) detecting ultrasound transmitted through and/or reflected from an interior of a battery during charging or discharging thereof;
(b) based at least in part on the detected ultrasound satisfying one or more predetermined thresholds, providing an indication of battery fault; and
(c) terminating operation of the battery in response to the provided indication of battery fault.

9. The method of claim 8, further comprising, prior to (b), based at least in part on the detected ultrasound satisfying a first threshold, providing an indication of potential failure of the battery.

10. The method of claim 9, wherein the first threshold is a first deviation of one or more features extracted from a detected ultrasound signal and/or a value for a rate of change of the one or more extracted features, as compared to a baseline extracted feature value obtained during normal operation of the battery.

11. The method of claim 10, wherein the one or more features comprises a feature extracted from a time series signal, a feature extracted from a Fourier Transform, a feature extracted from a Hilbert Transform, or any combination thereof.

12. The method of claim 9, wherein the indication of battery fault in (b)
is provided based at least in part on the detected ultrasound satisfying a second threshold different than the first threshold.

13. The method of claim 12, wherein the terminating of (c) is prior to catastrophic failure of the battery.

14. The method of claim 12, wherein the second threshold is a second deviation of one or more features extracted from a detected ultrasound signal as compared to a baseline extracted feature value obtained during normal operation of the battery.

15. The method of claim 14, wherein the one or more features comprises a feature extracted from a time series signal, a feature extracted from a Fourier Transform, a feature extracted from a Hilbert Transform, or any combination thereof.

16. A system for managing one or more energy storage devices during operations comprising:
a battery management system configured to manage charging or discharging of each of the one or more energy storage devices;
an ultrasound interrogation system electrically interfaced with the battery management system and configured to pass ultrasound energy through the one or more storage devices during the charging or discharging thereof;
a data memory configured to store (i) a capture data instance derived from ultrasound energy exiting the one or more energy storage devices and (ii) baseline ultrasound data corresponding with the one or more energy storage devices during the charging or discharging thereof;
a data processor in communication with the data memory, the data processor being configured to:
compare each capture data instance with the baseline ultrasound data; and
detect, based at least in part on the comparison, an abnormal operating state of any of the one or more energy storage devices during the charging or discharging thereof; and
an alarm system module operatively coupled to the data processor,
wherein the alarm system module is configured to issue an initial warning notification when an operating state of any one of the energy storage devices is determined to exhibit an operating state characteristic that differs from a normal operating state characteristic corresponding with the baseline ultrasound data.

17. The system of claim 16, wherein the ultrasound interrogation system is configured to pass ultrasound energy through each of the one or more energy storage devices during the charging or discharging thereof.

18. A system for managing one or more energy storage devices during operations comprising:
a battery management system configured to manage charging or discharging of each of the one or more energy storage devices;
an ultrasound interrogation system electrically interfaced with the battery management system and configured to pass ultrasound energy through the one or more energy storage devices during the charging or discharging thereof;
a data memory configured to store (i) a capture data instance derived from ultrasound energy exiting the one or more energy storage devices and (ii) baseline ultrasound data corresponding with the one or more energy storage devices during the charging or discharging thereof;
a data processor in communication with the data memory, the data processor being configured to:
compare each capture data instance with the baseline ultrasound data; and
detect, based at least in part on the comparison, an abnormal operating state of any of the one or more energy storage devices during the charging or discharging thereof; and
an alarm system module operatively coupled to the data processor,
wherein the alarm system module is configured to issue an initial warning notification when an operating state of any one of the energy storage devices is determined to exhibit an operating state characteristic that differs from a normal operating state characteristic corresponding with the baseline ultrasound data,
the alarm system module is further configured to issue an E-Stop command to at least one of the one or more energy storage devices when the ultrasound capture data instance is determined, by the data processor, to exhibit a precursor to thermal runaway, and
the E-stop command causes autonomous isolation of said at least one of the one or more energy storage devices from any current sources.

19. The system of claim 16, wherein the operating state characteristic comprises a precursor to thermal runaway of one of the one or more energy storage devices, and the initial warning notification is issued before the thermal runaway.

20. The method of claim 8, wherein the battery fault comprises a precursor to thermal runaway of the battery, and the terminating of (c) is before the thermal runaway of the battery.

21. The method of claim 1, wherein the one or more battery failure modes comprises a precursor to thermal runaway of a previously observed battery, and the terminating operation is before thermal runaway of the operating battery.

* * * * *